US007051759B2

(12) United States Patent
Reimer et al.

(10) Patent No.: US 7,051,759 B2
(45) Date of Patent: *May 30, 2006

(54) PROCESSING APPARATUS HAVING INTEGRATED PUMPING SYSTEM

(75) Inventors: Paul Reimer, Los Altos, CA (US); Pedram Sabouri, Santa Clara, CA (US); Dennis Smith, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 87 days.

This patent is subject to a terminal disclaimer.

(21) Appl. No.: 10/945,727

(22) Filed: Sep. 21, 2004

(65) Prior Publication Data

US 2005/0034767 A1 Feb. 17, 2005

Related U.S. Application Data

(60) Division of application No. 09/505,580, filed on Feb. 16, 2000, now Pat. No. 6,817,377, which is a continuation-in-part of application No. 09/220,153, filed on Dec. 23, 1998.

(51) Int. Cl.
*C23C 16/00* (2006.01)
*F04F 3/00* (2006.01)

(52) U.S. Cl. ............................ 137/565.23; 137/565.3; 137/565.33; 118/715; 118/719

(58) Field of Classification Search ........... 137/565.17, 137/565.23, 565.3, 565.33; 118/715, 719; 417/4, 5, 363

See application file for complete search history.

(56) References Cited

U.S. PATENT DOCUMENTS 4,179,244 A * 12/1979 Marple ....................... 417/273
4,539,822 A * 9/1985 Sundquist ................... 417/901
5,314,541 A * 5/1994 Saito et al. ................. 118/725
5,575,853 A * 11/1996 Arami et al. ............... 118/715
5,685,963 A * 11/1997 Lorimer et al. ............. 118/715
5,709,753 A * 1/1998 Olson et al. ................ 118/719

(Continued)

FOREIGN PATENT DOCUMENTS

EP 0 377 464 A2 7/1990

(Continued)

OTHER PUBLICATIONS

PCT Search Report dated Nov. 26, 2004; Application No. 99310475.1-2203.

*Primary Examiner*—John Rivell
(74) *Attorney, Agent, or Firm*—Patterson & Sheridan LLP

(57) ABSTRACT

An apparatus 115 for processing a substrate 20, comprises an integrated pumping system 155 having a high operating efficiency, small size, and low vibrational and noise levels. The apparatus 115 comprises a chamber, such as a load-lock chamber 110, transfer chamber 115, or process chamber 120. An integrated pump 165 is abutting or adjacent to one of the chambers 110, 115, 120 for evacuating gas from the chambers. In operation, the pump is located within the actual envelope or footprint of the apparatus and has an inlet 170 connected to a chamber 110, 115, 120, and an outlet 175 that exhausts the gas to atmospheric pressure. Preferably, the integrated pump 165 comprises a pre-vacuum pump or a low vacuum pump and is housed in a noise reducing enclosure having means for moving the pump between locations and means for stacking pumps vertically in use.

17 Claims, 17 Drawing Sheets

U.S. PATENT DOCUMENTS

| | | | | |
|---|---|---|---|---|
| 5,718,563 | A * | 2/1998 | Hutchinson | 417/32 |
| 5,769,626 | A * | 6/1998 | Hauff et al. | 432/72 |
| 5,944,049 | A * | 8/1999 | Beyer et al. | 137/487.5 |
| 6,251,192 | B1 * | 6/2001 | Kawamura et al. | 118/719 |
| 6,345,960 | B1 * | 2/2002 | Persson et al. | 417/313 |
| 6,817,377 | B1 * | 11/2004 | Reimer et al. | 137/565.23 |

FOREIGN PATENT DOCUMENTS

| | | |
|---|---|---|
| EP | 0 398 365 A2 | 11/1990 |
| EP | 0 452 939 A1 | 10/1991 |
| EP | 0 698 915 A1 | 2/1996 |
| WO | WO 98/48168 | 10/1998 |

* cited by examiner

Vent To Atmosphere
180
Exhaust Scrubber
220
Computer Controller
Pump Controller
235
230
155
225
P
120
130
125
190a
185
170a
240
175a
138
140
135
102
Process Gas
145
High Vacuum Pump
Pre-vacuum Pump
182
160
165a
136
118
190b
Pre-vacuum Pump
175b
115
105
170b
165b
110
Pre-vacuum Pump
175c
170c
165c
100
10
Cleanroom Floor 166b
165a
166d
166a
164
166c
167a
166a
165b
168b
173
172
168a
194
171
173

PROCESSING APPARATUS HAVING INTEGRATED PUMPING SYSTEM

CROSS-REFERENCE TO RELATED APPLICATIONS

This application is a divisional of U.S. patent application Ser. No. 09/505,580, filed Feb. 16, 2000 now U.S Pat. No. 6,817,377, which claims benefit of U.S. patent application Ser. No. 09/220,153, filed Dec. 23, 1998. Each of the aforementioned related patent applications are herein incorporated by reference.

BACKGROUND OF THE INVENTION

1. Field of the Invention

The present invention relates to an apparatus for processing substrates with an integrated pumping system for evacuating gas.

2. Description of the Related Art

FIG. 1 is a cross sectional view of a conventional apparatus 15 for processing a substrate 20. The apparatus 15 comprises process chambers 25*a*, transfer chambers 25*b*, and load-lock chambers 25*c* mounted contiguously on a platform 28 with openings for transferring substrates between the chambers. In the process chamber 25*a*, a process gas is used to etch features, deposit layers of material on a substrate 20, or clean the chamber. The apparatus 15, is isolated in a clean room or semi clean room 30 to separate and protect the substrates from other potentially harmful equipment.

A pumping system 35 is provided to evacuate the gas and create vacuum conditions within the chambers 25*a–c*. Pumping system 35 typically comprises a high vacuum pump 40, such as a turbo molecular pump; a low vacuum pump 45, such as a rotary blower pump; and a pre-vacuum pump 50*a–c*, such as a dry vacuum pump. Conventionally, the large low vacuum or pre-vacuum pumps are stored in enclosures or “garages” in a remote location in the fabrication facility. To detect and contain any leaks of the gases being pumped, the air around the pumps is ventilated by a large air collector located at the top of the garage. The high vacuum pump 40 can be housed in the clean room, as shown in FIG. 1, because it is smaller in size, relatively quiet and creates less noise and vibration than low vacuum and pre-vacuum pumps 45, 50*a–c*. Additionally, the high vacuum pump 40, unlike the low and pre-vacuum pumps 45, 50*a–c*, exhausts gas to another pump, not to atmosphere. Typically, the inlet 55 of the high vacuum pump 40 is connected to the process chamber 25, and its outlet 60 is connected to a foreline 65*a* that extends from the chamber to which it is connected to the intake 70 of the low vacuum pump 45, which in turn, is coupled to the intake of the pre-vacuum pump 50*a*. The pre-vacuum pump 50*a* exhausts to an exhaust scrubber 72. The pre-vacuum pump 50*a* reduces the pressure of the process chamber 25*a* from atmospheric pressure (760 Torr) down to a pressure of about 0.01 Torr; the low vacuum pump 45 reduces the chamber pressure for higher gas flows; and only when the chamber pressure is below 0.1 Torr is the high vacuum pump 40 operated to achieve a high vacuum below 0.1 Torr down to $10^{-7}$ Torr. Another type of high vacuum pump is the cryopump, which is used alone or in conjunction with the turbomolecular pump. The pre-vacuum pump 50 is also used in conjunction with a cryopump (not shown) to pump down the process chambers fast. Pre-vacuum pumps 50 and low vacuum pumps 45 are most commonly used in semiconductor processing apparatus. However, some semiconductor processing apparatus also use high vacuum pumps or cryopumps in conjunction with the pre-vacuum and low vacuum pumps to achieve higher vacuum levels within the chambers to which they are connected. A low vacuum pump 45 is essentially a single stage blower typically mounted on top of the prevacuum pump 50 in order to increase the pumping performance of the pre-vacuum pump.

As depicted in FIG. 1 and discussed below, the pre-vacuum pumps and low vacuum pumps have traditionally been placed outside of the clean room in an adjacent room or basement. There are a number of reasons for this remote placement of the pumps. First, the low and pre-vacuum pumps are large pumps that occupy an envelope of about 0.4 $m^2$ each. An “envelope” of space is typically a rectangle having sides defined by the edges of a component or components making up an apparatus. A “footprint” is the envelope of an apparatus with an additional two feet added to each side. As a point of reference, the entire envelope of some processing apparatus like the one shown in FIG. 1, is only about 6 $m^2$. Therefore, six of the low or pre-vacuum pumps could occupy about one-half the space needed for an entire processing apparatus. The space problem associated with the large conventional pumps is magnified by the fact that the pumps are not designed to service more than one chamber and, therefore, each chamber requires its own dedicated pump. The conventional pumps disposed remotely from the processing systems also have intake ports, exhaust ports and other machine interfaces dispersed around various pump surfaces. The distribution of the connection points further increases the space required by each pump.

One problem associated with conventional pumps is contamination and heat generation which necessitate their separation from the processing apparatus. For example, conventional the low and pre-vacuum pumps are mounted in a frame built around their interior components allowing them to be arranged in rows or stacked on shelves in their remote location. With no enclosure to separate the inner workings of the pump from the surrounding environment, any equipment nearby is subject to the discharge of heat and particles from the pump.

Conventional low and pre-vacuum pumps are also heavy, noisy and cause vibration. For example, each pump weighs about 450 lbs. or more and creates noise of at least 65 db. Vibration of a single pump weighing 450 lbs. can exceed 3.0 $m/s^2$. This level of vibration is not allowable near a process apparatus where robot arms are moving delicate wafers to and from process stations and wafer structures are being created in the 0.18–0.25 $10^{-6}$ m range.

As a result of the location of the pumps relative to the processing system, the forelines 65*a–c* between the pumps 40, 45, 50*a–c* and the chambers 25*a–c* have a large diameter to provide a high conductance pathway that has a reduced pumping load and resistance. The distance between the clean room and the low and pre-vacuum pumps can often require a 50 to 100 foot length of foreline 65*a–c*. These extended lengths require that the forelines 65*a–c* have a large diameter to operate the low and pre-vacuum pumps with reasonable efficiency. Typically, the foreline 65*a–c* is a stainless steel pipe, which resists corrosion from the process gas, having a diameter of 50 to 100 mm (2 to 4 inches). However, the large diameter stainless steel pipe is expensive and a long length of pipe can cost as much as the pump itself. In addition, the large number of elbow joints and connections in the long foreline extending from the clean room to a separate room, have to be carefully sealed with non-corrodible gas seals to avoid leaks and releasing hazardous and toxic gases during operation, which further adds to large capital costs in semiconductor fabrication facilities. Also, the pipes are sometimes heated to reduce the deposition of condensates on the inside surfaces of the pipes, another high expense associated with long, large diameter forelines.

Furthermore, even with large diameter forelines 65_a–c_, the efficiency of the low and pre-vacuum pumps 45, 50_a–c_ is often decreased by a factor of 2 to 4 because of the loss in pumping efficiency caused by the large length of intervening pipeline. Additionally, the large diameter and long length of the forelines 65_a–c_ provide a large surface area that serves as a heat sink upon which condensates are deposited from the process gas flowing in the lines. In some processes, these condensates are dislodged and loosened by vibrations from the pumps 45, 50_a–c_ and can diffuse back into the chambers 25_a–c_ and contaminate substrates processed therein.

The remote location of the low and pre-vacuum pumps also prevents pressure within the chambers 25_a–c_ from being reduced in a responsive or fast manner because of the distance between the chamber and the pump. Typically, the chamber pressure is measured by the pressure gauge 80 which feeds a pressure signal to a throttle valve controller 90 which opens or closes the throttle valve 75_a,b_ to control the pressure of gas in the chamber 25_a–c_. However, this system is slow to respond to pressure fluctuations caused by entry of substrates 20 into the chambers 25_a–c_, transfer of substrates, or changes in a gas flow rate. In addition, the pressure reduction time obtained from "soft start" valves 76 is too slow. The soft gradual pressure reduction is used to prevent moisture condensation when lowering chamber pressure of a load-lock chamber for instance, from atmospheric pressures to the mTorr range, by using two different size valves 76. A smaller valve opening having a low conductance is opened when pumping the chamber down from one atmosphere to about 100 to 300 Torr, and a large sized valve is opened when pumping the chamber down to lower pressures. The two-cycle process provides a soft or gradual reduction in chamber pressure in stages that minimizes moisture condensate in the chambers 25_c_. However, the time for pressure reduction during the small valve opening step of the process is often excessively long for high throughout fabrication processes, resulting in an increased process cycle time and an inefficient use of the vacuum pumps.

Moisture condensation in the chambers during pump down is a particular problem with long forelines between the chamber and the pump. The problem arises because the volume within the long, large diameter forelines is typically equal to the volume in the chamber. For example, with remotely located pumps, a chamber having a volume of 30 liters may require a foreline also having a volume of 30 liters. When an isolation valve between the chamber and the evacuated foreline is opened, exposing the chamber to the lower pressure foreline, the pressure in the chamber is reduced by as much as one half. The temperature within the chamber can fall to a temperature of less than the dew point causing condensation of water on the walls of the chamber. With long forelines, the problem of condensation in the chamber during pump down is managed by using the soft start valves described above to gradually reduce the chamber pressure and prevent condensation. However, as described above these valves result in high pressure reduction times and represent an additional expense.

SUMMARY OF THE INVENTION

The present invention generally provides an integrated pumping system and a semiconductor processing apparatus configured with an integrated pumping system. In one aspect of the invention, a pump exhausting gas to atmosphere is provided with a secondary enclosure having noise and vibration reducing features, machine interfaces located on a single surface of the enclosure. The pump may include movement members, such as casters or rollers, to facilitate movement of the pump within a fabrication facility.

In another aspect of the invention, a substrate processing apparatus is provided that includes an integrated pumping system wherein the pumps are dispersed within a clean room and within the envelop or footprint of the apparatus. The pumps are locatable in a variety of positions with respect to the apparatus, including below and adjacent the processing chambers, and can be stacked vertically to increase space efficiency. Further, exhaust lines from the pumps can be bundled together and the pump enclosure can be ventilated by circulating air therethrough.

In another aspect of the invention, the apparatus comprises a transfer chamber mounting a plurality of processing chambers and one or more load-lock chambers with one pump operating both load-lock chambers and one pump operating the transfer chamber. Preferably, the pumps are stacked vertically and are disposed partially under one of the load-lock chambers and are fully contained within the envelope or footprint of the apparatus.

BRIEF DESCRIPTION OF THE DRAWINGS

These and other features, aspects, and advantages of the present invention will become better understood with regard to the following description, appended claims, and accompanying drawings which illustrate examples of preferred embodiments of the invention, where:

DETAILED DESCRIPTION

Figure 2:
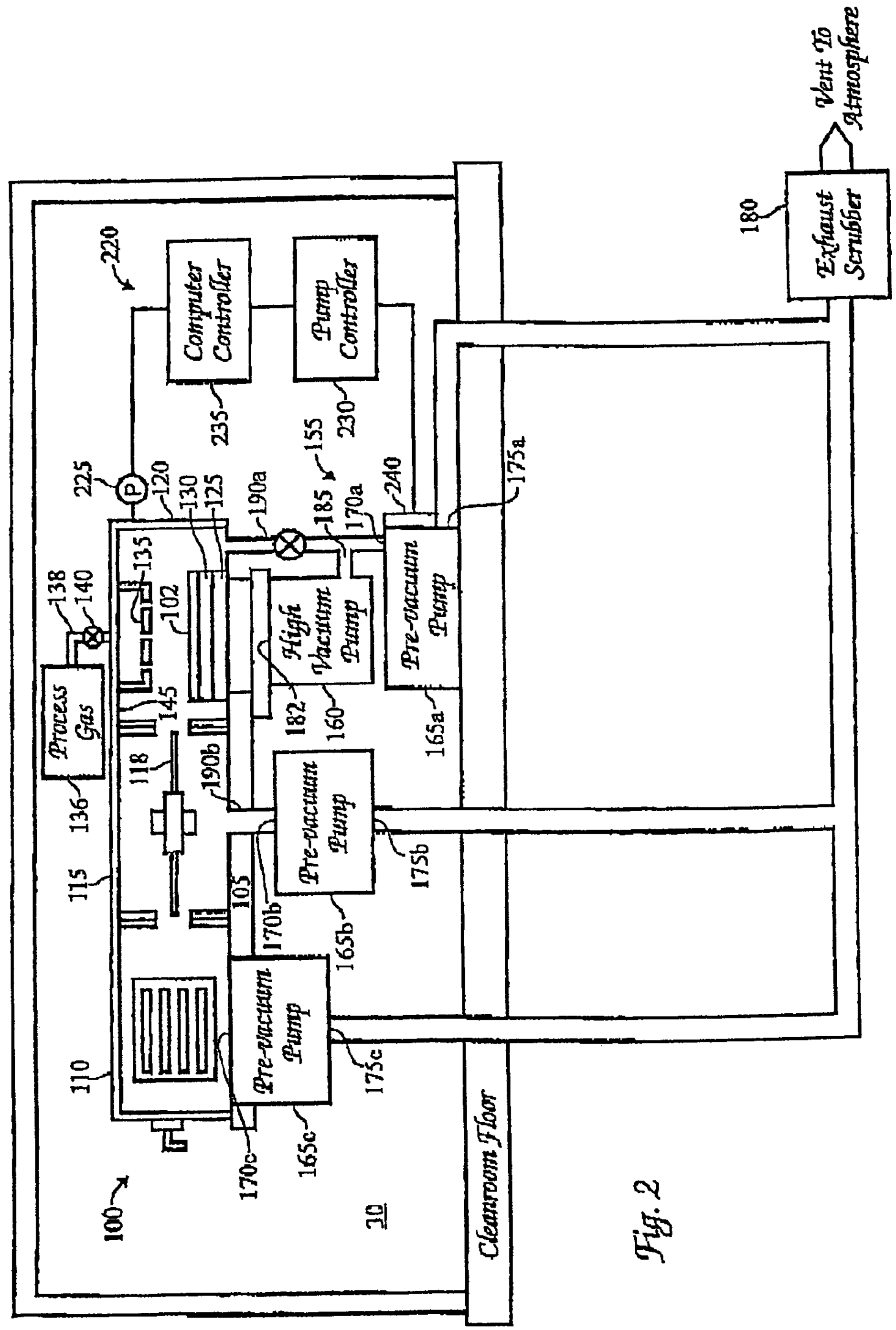
FIG. 2 is a schematic view of a semiconductor processing apparatus according to the present invention showing integrated, pre-vacuum pumps adjacent chambers and an absence of long forelines between the chambers and the pre-vacuum pumps.

An exemplary apparatus 100 according to the present invention for processing a substrate 20, such as a silicon wafer, is illustrated in FIG. 2. The apparatus 100 comprises a platform 105 having a plurality of chambers each of which are shaped and sized to hold or enclose one or more substrates 20 (not visible). The chambers are interfaced to one another and typically include load-lock chambers 110, a transfer chamber 115, and process chambers 120, that are mounted contiguously with openings to transfer substrates therebetween. The load-lock chambers 110 hold cassettes that contain batches of substrates 20. The centrally located transfer chamber 115 comprises a robot arm 118 which picks up and transfer substrates 20 from the cassette in the load-lock chamber 110 into a process chamber 120, and after processing of the substrate in the chamber 120, transfers the substrate to other process chambers (not shown) on the platform 105. When the substrate 20 has finished processing, the robot 118 picks it up from the last process chamber and transfers it to another process chamber or load-lock chamber (not shown) reserved for unloading. Although the present invention is illustrated by an apparatus for processing substrates, such as semiconductor wafers, the invention can also be used for processing other substrates, such as flat panel displays, circuit boards, and liquid crystal displays, disk drives, and in other chambers as apparent to those skilled in the art and without deviating from the scope of the invention.

The process chamber 120 forms an enclosure for a support 125 for supporting a substrate 20, such as a semiconductor wafer. The substrate 20 is held on the support 125 by an electrostatic chuck 130. Metals commonly used to fabricate the process chamber are for example, anodized aluminum, stainless steel, 1NCONEL®, silicon oxide, boron carbide, or aluminum oxide. The support 125 is typically made from aluminum with an anodized coating resistant to corrosion in the process gas. A process gas distributor 135 comprises a plurality of nozzles that are spaced apart arid distributed to flow process gas around the substrate 20. The process gas is supplied from one or more process gas supplies 136 via process gas lines 138 and their flow rate regulated by flow control valves 140. The process gas is energized to process a substrate by a process gas energizer that couples electromagnetic RF or microwave energy to the process gas to form an energized process gas or plasma. The process gas can be activated in the chamber 120 by inductive coupling by applying an RF current to an inductor coil (not shown) encircling the chamber. In the embodiment shown in FIG. 2, the process gas is energized by capacitive coupling RF energy to process electrodes in the chamber 120. Preferably, at least a portion of the support 125 comprises an electrically conductive metal electrode that is chargeable to serve as the process electrode. A partially facing conducting or semi-conducting portion of a ceiling 145 of the chamber serves as the other process electrode. The frequency of the RF applied to the process electrodes is typically about 50 KHz to about 60 MHz, and more typically about 13.56 MHz. The RF voltage applied to the process electrodes is at a power level of from about 100 to about 2000 Watts; and/or an RF current at a power level of from about 750 to about 2000 Watts is applied to the inductor coil.

In operation, one or more substrates are placed in the process chamber 120 which is evacuated by a pumping system 155. The process chamber 120 can be used to deposit material on a substrate 20 such as by chemical or physical vapor deposition or etch layers on the substrate. Chemical vapor deposition processes that can be performed in the apparatus 100 to deposit coatings on the substrate are generally described in VLSI Technology, 2nd Ed., Ed. by Sze, McGraw-Hill Publishing Co., New York, which is incorporated herein by this reference. For example, typical CVD processes for depositing $SiO_2$ use a silicon source gas, for example $SiH_4$ or $SiC1_2H_2$, and an oxygen source process gas such as $CO_2$ and $H_2O$, or $N_2O$; or a process gas containing both silicon and oxygen such as $Si(OC_2H_5)_4$. $Si_3N_4$ is deposited from gases such as $SiH_4$ and $NH_3$ or $N_2$. Other commonly used process gases include $NH_3$, $WF_6$, and $SiH_4$. The apparatus can also be used for etching dielectric and metal layers, as generally described in VLSI Technology by S. M. Sze, McGraw-Hill Publishing Company (1988), which is also incorporated herein by reference. Typical metal etching processes use gases such as HBr, $BCl_3$, $Cl_2$, HCl, $SF_6$, $CF_4$, and $CHF_3$. Resist stripping processes use $0_2$ and other gases to strip resist from the substrate. Cleaning gases for cleaning the chamber include $NF_3$ and $CF_4$.

An integrated and locally positioned pumping system 155 evacuates and exhausts the gas from one or more of the chambers. The load-lock chamber 110 is evacuated each time a new batch of substrates is placed in or removed from the chamber. Generally, the transfer chamber 115 containing the robot arm 118 is maintained at a low pressure during the entire processing sequence. The process chamber 120 is evacuated before introducing process gas in the chamber to process the substrate 20, after-processing of the substrate, and during cleaning by cleaning gas. The pumping system 155 can comprise separate pumps for each chamber, assemblies or sets of pumps, or a single pump for multiple chambers, as described below.

A preferred integrated pumping system 155 for the process chamber 120 comprises a high vacuum pump 160 and a pre-vacuum pump 165*a*—both of which are positioned in the immediate environment or within the footprint of the apparatus 100, as shown in FIG. 2, and not in a separate room or basement. While a variety of locations are possible using the integrated pumps, in one embodiment, the pumping system 155 comprises a pre-vacuum pump 165*a* adjacent to or abutting the chamber, having an inlet 170*a* connected to the chamber to evacuate gas from the chamber, and having an outlet 175*a* that exhausts the evacuated gas to atmospheric pressure via an exhaust scrubber 180. The pre-vacuum pump 165*a* is capable of evacuating the gas in the chamber 120 from atmospheric pressure to a pressure of less than about $10^{-2}$ Torr range. In addition, the high vacuum pump 160 is provided to drop the chamber pressure down from the low pressure range to high vacuum of $10^{-3}$ Torr range. The high vacuum pump 160 has an inlet 182 connected to the chamber and an outlet 185 that exhausts directly to the pre-vacuum pump 165*a*. The high vacuum pump 160 is capable of evacuating the chamber from a pressure of about $10^{-2}$ Torr to a pressure as low as about $10^{-}9$ Torr. Also, the high vacuum pump 160 can only operate within a narrow and low pressure range and cannot pump down the chamber from atmospheric pressure. Only after the pre-vacuum pump 165*a* pumps down the chamber to a low pressure can the high vacuum pump 160 be operated to further reduce the chamber pressure to ultra-low pressures. Unlike the remote pumping system 35 shown in FIG. 1, in an integrated pumping system 155 there is no need for a low vacuum pump 45 in additional to the pre-vacuum pump 165*a* to operate the process chamber.

Generally, the load-lock chamber 110 and the transfer chamber 115 do not need a high vacuum pump 160 because they do not need to be pumped down to a high vacuum. Thus, these chambers operate with only an integrated pre-vacuum pump 165*b,c* having an inlet 170*b,c* connected to one of the chambers 110, 115 for evacuating the gas from the chamber and an outlet 175*b,c* that exhausts the process gas directly to atmospheric pressure via the exhaust scrubber 180. The transfer chamber 115 has a short length of foreline 190*b* or has no forelines between the inlet 170*b* of the pre-vacuum pump 165*b* and the chamber 115. The load-lock chamber 110 has a short length of foreline or does not have any forelines 190*a,b* between the inlet 170*c* of the pre-vacuum pump 165*c* and the chamber 110 because the pump is connected directly to and abutting the load-lock chamber 110.

It has been discovered that the process efficiency and pump down time of the chambers is substantially improved with the use of integrated pumps located within the envelope or footprint of the apparatus. In one aspect, the apparatus of the present invention comprises a short length of foreline 190*a,b*, or no foreline at all, between the chambers 110, 115, 120 and their associated pumps 165*b,c* or set of pumps 160, 165*a*. For example, in the exemplary process chamber of the apparatus, a foreline having a length of about 0.5–2.0 m extends from the pre-vacuum pump 165*a* to the process chamber. The inlet of the high vacuum pump 182 is connected to the chamber, and its outlet to the foreline. In the transfer chamber, the pump is connected directly to the transfer chamber with or without a foreline having a short length of 0–2.0 m. For the load-lock chamber, the pre-vacuum pump 165*c* is coupled to the chamber with or without any foreline. Preferably, the inlet between the pump feeds to the chamber through a short foreline having a length of less than about 2.0 m, and more preferably less than 0.5 m.

Figure 1:
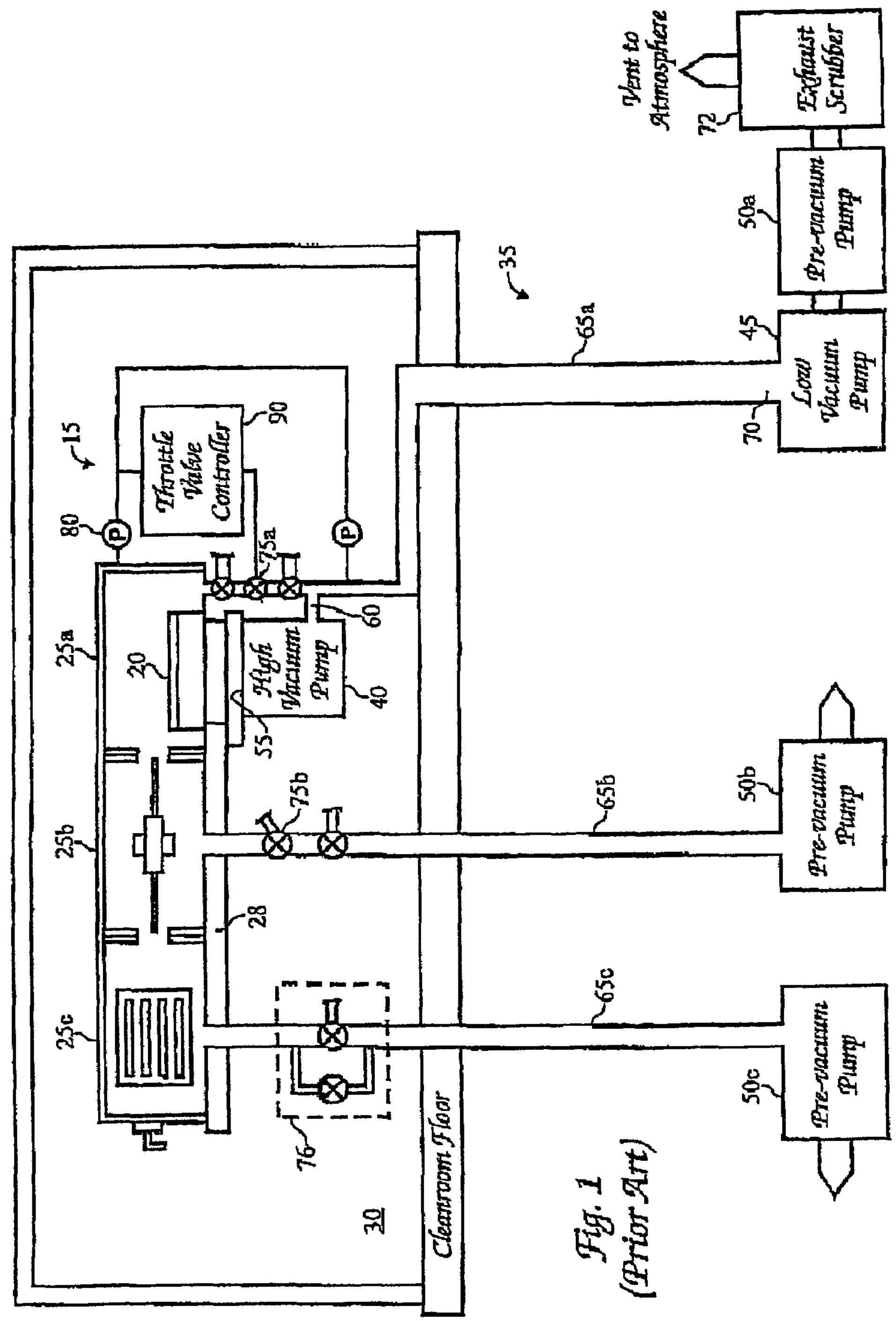
FIG. 1 is a schematic view of a conventional semiconductor processing apparatus for processing a substrate showing multiple chambers connected to a pumping system comprising a high vacuum pump and remotely located low vacuum pumps, pre-vacuum pumps, and an exhaust scrubber.
Figure 3:
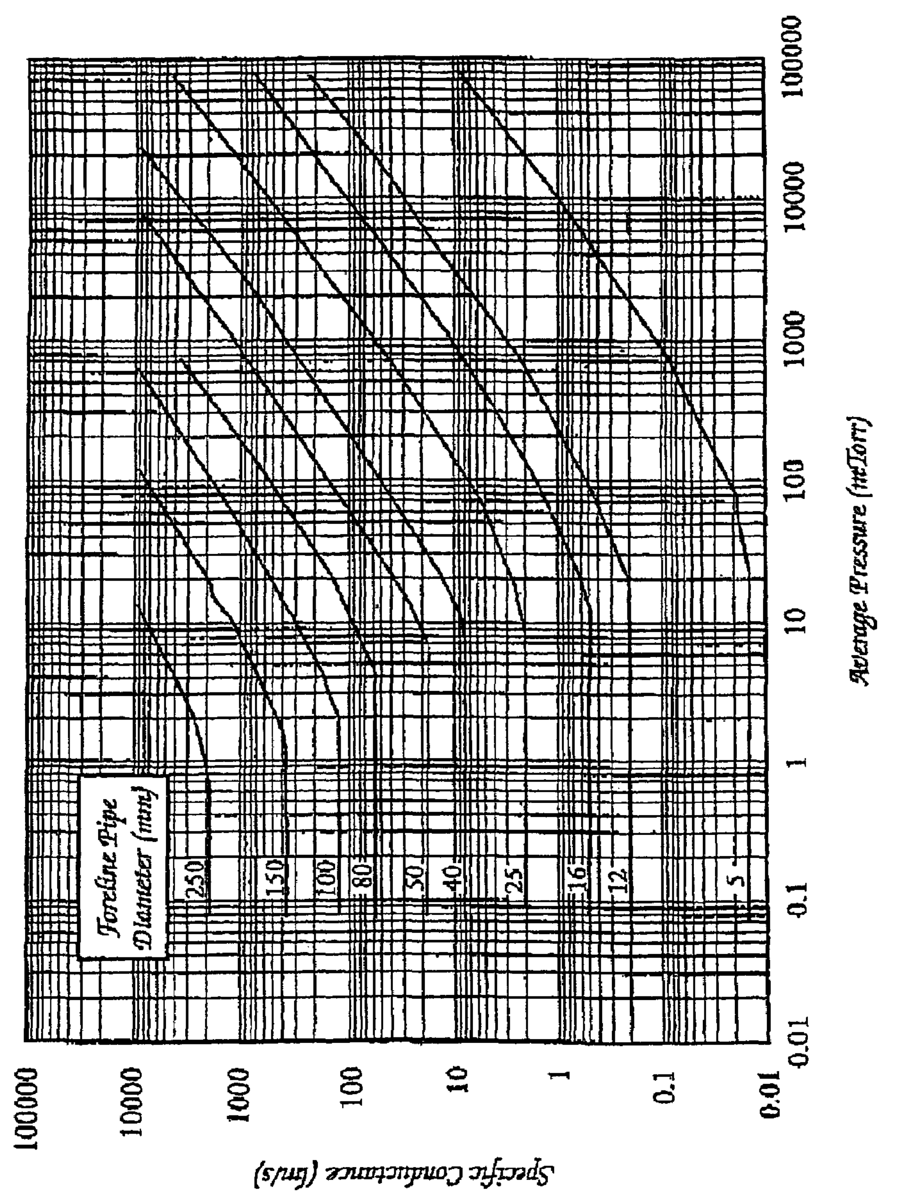
FIG. 3 is a graph showing the specific foreline conductance for increasing gas pressures and for different pipe diameters.

It has been discovered that losses in pumping efficiency evident in the prior art systems shown in FIG. 1, are largely due to the losses in pumping conductance that arise from a long length of foreline between the pumps and the chambers. FIG. 3 shows the specific conductance of foreline pipes for increasing gas pressure in a chamber and for different foreline pipe diameters. For a given foreline pipe diameter, as the gas pressure increases, the specific conductance of the foreline does not change from gas pressures of about 0.1 to about 1–10 mTorr, and thereafter, the specific conductance increases sharply for increasing gas pressure. However, as the foreline pipe diameter increases from 5 to 250 mm, the average chamber pressure at which the specific conductance begins to increase, drops down from 10 mTorr down to 1 mTorr. For example, FIG. 3 shows that at an average foreline pressure of 500 mTorr, the specific conductance of forelines with diameters 40 mm and 100 mm change drastically from 200 1 m/s to 8000 1 m/s, respectively. This means the conductance of a foreline with 1 m length and 40 mm diameter is 200 1/s, and the conductance of a foreline with 1 m length and 100 mm diameter is 8000 1/s. The conductance of a foreline with 10 m length and 40 mm diameter is 20 1/s, and the conductance of a foreline with 10 m length and 100 mm diameter is 800 1/s. Therefore, the length and diameter of the foreline has a substantial impact on conductance.

Figure 4:
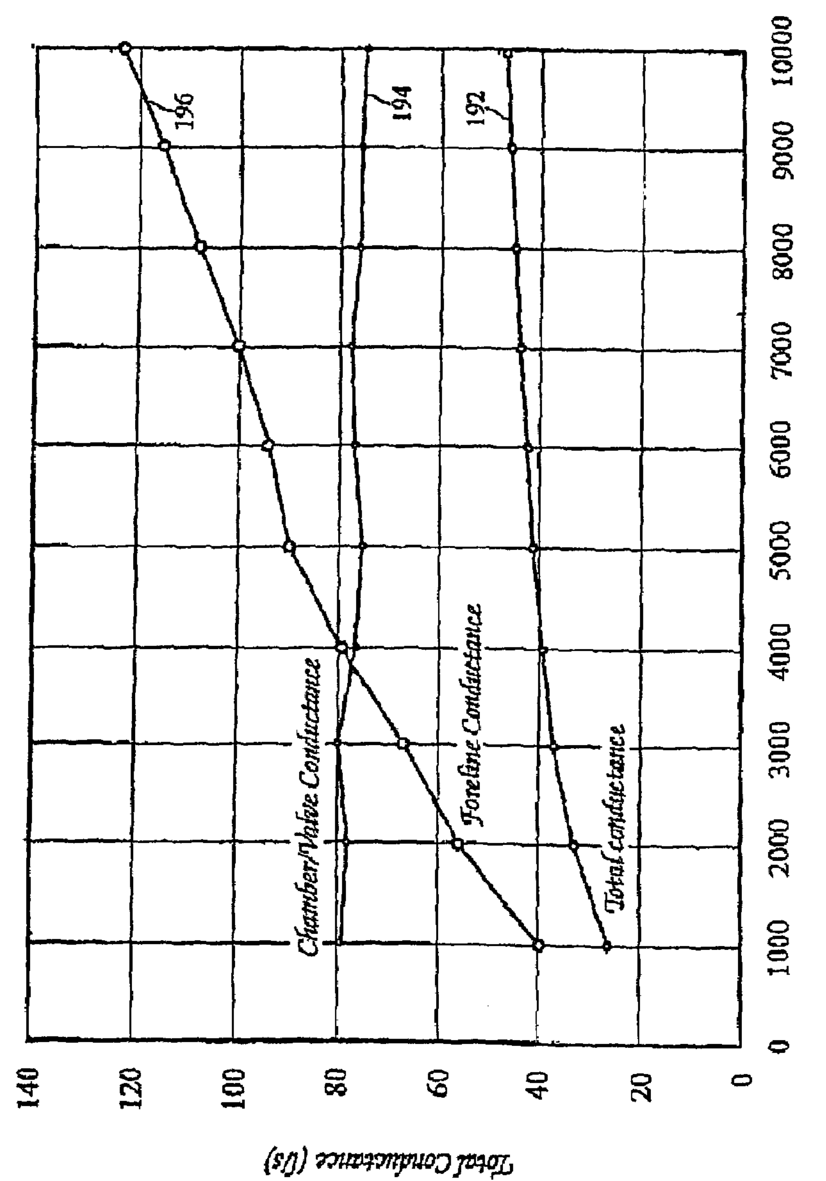
FIG. 4 is a graph showing foreline conductance, chamber and valve conductance, and the total conductance for increasing flow rates of gas in a chamber.

Also, the total pumping conductance loss increases in more than simply an additive function of the conductance loss from the foreline and that from the chamber and valve. For example, FIG. 4 shows the total conductance (line 192) in relation to the chamber and valve conductance (line 194) and the foreline conductance (line 196) for increasing flow of gas in a chamber. The total conductance $C_T$ is given by $1/C/_T=1/C_{C/V}+1/C_F$ where $C_{C/V}$ is the combined chamber and valve conductance, and $C_F$ is the foreline conductance. Thus, the total conductance $C_T$ is always smaller than the chamber/valve conductance $C_{C/V}$ and is always smaller than the foreline conductance $C_F$ and, in fact, is smaller than the smaller of the two. In addition, while the chamber/valve conductance curve 194 is a relatively straight line for increasing gas flow, the foreline conductance curve 196 increases as the flow rate of the gas is increased. However, since the total conductance 192 is always smaller than both 194 and 196, even the increase of 196 has a small effect on 192 because 194 has remained relatively constant with increasing gas flows. This is a limiting factor for chambers requiring higher flowrates. FIG. 4 also shows that for gas flows up to 4000 sccm, which cover the majority of semiconductor processes, the foreline conductance is the dominating conductance and has the major effect in lowering the total conductance. Thus, the foreline conductance plays a critical role, and increasing it by using a shorter foreline has a substantial effect on increasing total conductance.

The long forelines result in large losses of pump capacity because of their low conductance. Table I shows calculated foreline losses which are the losses in pump capacity or pumping speed that arise because of the length of the foreline between the pump and chamber, as a function of the length and diameter of the foreline. For example, for a foreline having a constant length of 20 meters, the foreline losses increase from 37% to 65%—as the foreline diameter decreases from 100 to 40 mm. Similarly, for a foreline having a constant diameter of 40 mm, the foreline losses increase from 48% to 65%—as the length of the foreline increases from 10 to 20 m. Thus, the shorter the length of the foreline, the higher the conductance of the foreline and the lower are the pumping losses of the pumping system 155. Additionally, the shorter, smaller diameter forelines minimize moisture condensation in a chamber when the chamber is opened to the evacuated foreline during pump down.

Figure 5:
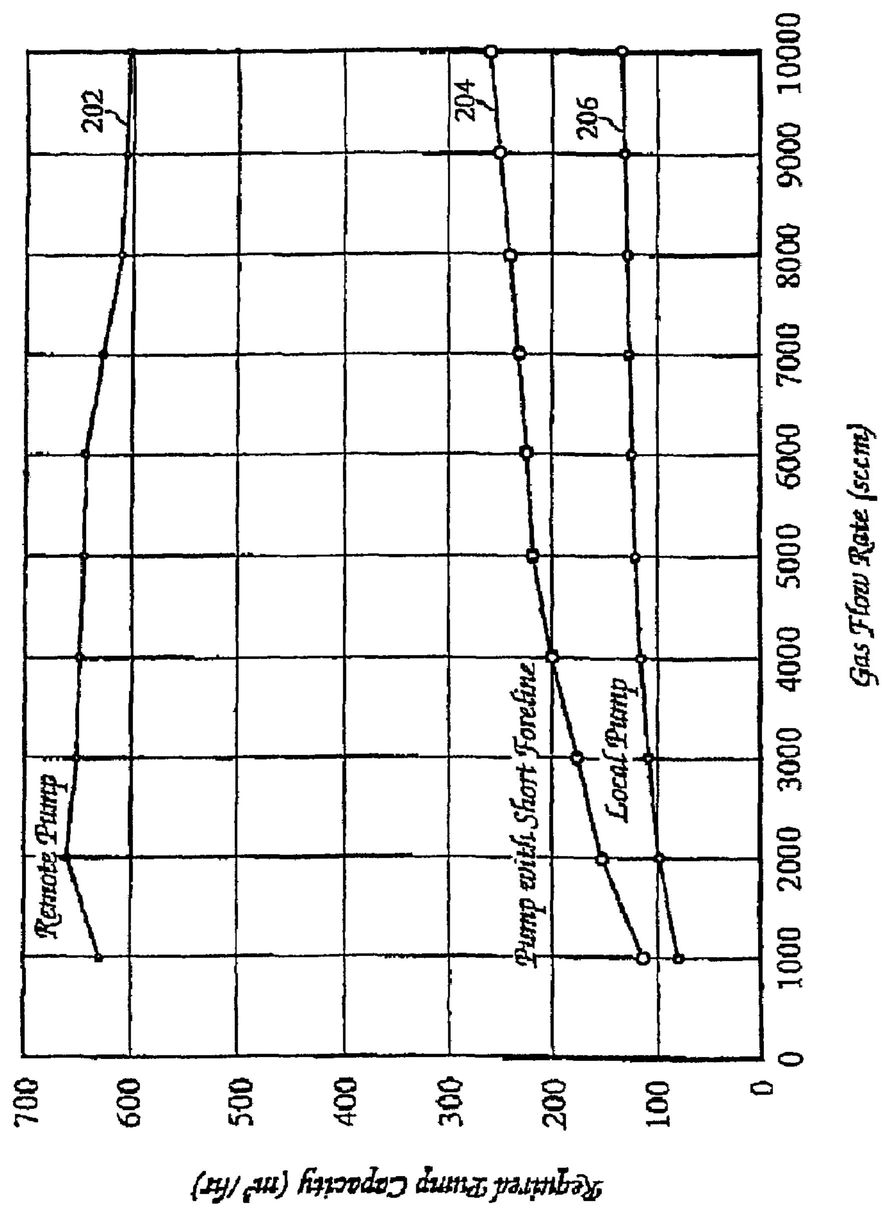
FIG. 5 is a graph showing the required pump capacity (or pumping speed) of a integrated pump without a foreline, a pump having a short foreline, and a remote pump having a long foreline, as a function of gas flow rate for maintaining a constant chamber pressure.

The integrated pumping system 155 illustrated in FIG. 2 operates far more efficiently than the remote pumping system 35 illustrated in FIG. 1, because the location of the pumps 165*a–c* within the envelope of the apparatus removes the need for low conductance pipelines, forelines, and valves and also because the, integrated pumps are substituted for the larger capacity remote pumps that are used in conventional apparatus 15. For example, FIG. 5 shows the required pump capacity (or pumping speed) as a function of process gas flow rate for a remotely located pump, an integrated pump of the present invention with a short foreline, and an integrated pump directly abutting a chamber with no foreline at all. Line 202 shows the pumping speed of a conventional remote pump with a long 50-foot foreline 65*a–c*, and that is located in remote environment from a processing apparatus 15, for example, as shown in FIG. 1. Line 204 shows the pumping speed of an integrated pump 165*a,b* having a short foreline 190*a,b* which demonstrates a substantial increase in pumping efficiency, as shown in FIG. 2. Line 206 shows the even higher efficiency of an integrated pump 165*c* with no foreline at all. The difference in height between lines 202 and 206 represents the increase in pump capacity arising from the higher conductance between the pump and the chamber. Thus, foreline losses that accounted for 60 to 80% of the total conductance losses were eliminated by the present pumping system 155.

Figure 6:
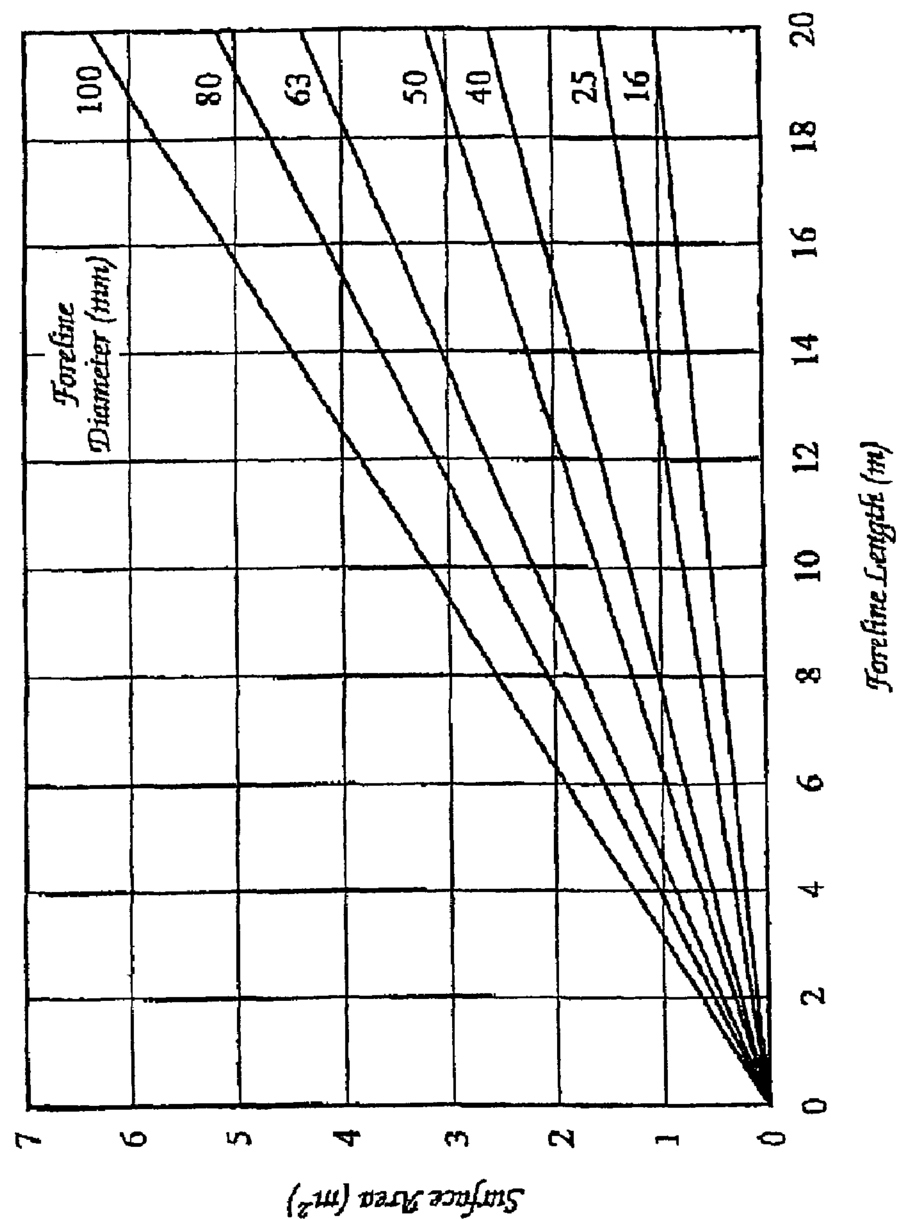
FIG. 6 is a graph showing the increase in deposition surface area of the internal surfaces of a foreline pipe as a function of its length and diameter.

As a result of reducing the length of the foreline 190*a,b*, it is also possible to use a foreline having a small diameter. This is because a large diameter foreline has a large surface area that serves as a heat sink upon which condensates are deposited from the process gas flowing in the pipeline. These condensates are dislodged and loosened by vibrations from the pumps 165*a–c* and can diffuse back into the chambers 120 to contaminate and reduce the yield of the substrate 20. For example, FIG. 6 shows the increasing deposition area provided by the internal surfaces of forelines having increasing diameters of 16 to 100 mm and foreline lengths. For example, a foreline having a diameter of 40 mm and a length of 1 m has a surface area of approximately 0.128 $m^2$, while a foreline having a diameter of 100 mm and a length of 20 m has a surface area of 6.4 $m^2$, which is about 50 times larger. The larger area provides a much bigger surface for condensates to be deposited upon from the process gas flowing in the foreline 190*a*. Therefore, it is desirable to have a foreline with a diameter of less than about 80 mm, and more preferably less than about 50 mm. These smaller diameters reduce the foreline surface area by a factor of 10 from an average of about 4 $m^2$ to less than about 0.4 $m^2$.

In addition to a reduction in size or an elimination of forelines, an integrated pump of the present invention can also utilize a smaller diameter exhaust line which is typically routed to a remotely located scrubber. For example, a 100 $m^3$/fhr. pre-vacuum pump of the present invention located in an envelope of the apparatus can be exhausted through a line having a diameter of 1" rather that 2" as required by conventional pumps located remotely. Additionally, because the lines are smaller in diameter, the exhaust gas travels at a higher velocity through the line and is less likely to leave condensed particles or become clogged. For example, a 1" line results in a velocity of gas 4 times faster than a 2" line. The faster moving gas is less likely to leave behind particles deposited on the walls of the gas line that can cause clogging. The 1" exhaust lines are also easily more efficiently insulated and heated compared to 2" exhaust lines or the 2–4" large diameter vacuum lines 65*a–c* on the prior art apparatus.

In one embodiment, exhaust lines from the integrated pumps are bundled closely together and a single heater, preferably constructed of insulating material and warmed with an electrical current through a conductor, is wrapped

TABLE 1

| FORELINE | | | | | | VACUUM PUMP | | FORELINE |
|---|---|---|---|---|---|---|---|---|
| Pipe Length (m) | Pipe Diameter (in) | Pipe Diameter (mm) | Specific Conductance (1 m/s) | Conductance (1/s) | Conductance ($m^3$/hr) | Pump Speed ($m^3$/hr) | Effective Speed ($m^3$/hr) | Piping Losses (%) |
| 20 | 1.5 | 40 | 300 | 15 | 54 | 100 | 35 | 65 |
| 20 | 2 | 50 | 750 | 38 | 135 | 100 | 57 | 43 |
| 20 | 2 | 50 | 750 | 38 | 135 | 250 | 88 | 65 |
| 20 | 3 | 80 | 3000 | 150 | 540 | 250 | 171 | 32 |
| 20 | 3 | 80 | 3000 | 150 | 540 | 500 | 260 | 48 |
| 20 | 3 | 80 | 3000 | 150 | 540 | 1000 | 351 | 65 |
| 20 | 4 | 100 | 9500 | 475 | 1710 | 1000 | 631 | 37 |
| 10 | 1.5 | 40 | 300 | 30 | 108 | 100 | 52 | 48 |
| 10 | 2 | 50 | 750 | 75 | 270 | 100 | 73 | 27 |
| 10 | 2 | 50 | 750 | 75 | 270 | 250 | 130 | 48 |
| 10 | 3 | 80 | 3000 | 300 | 1080 | 250 | 203 | 19 |
| 10 | 3 | 80 | 3000 | 300 | 1080 | 500 | 342 | 32 |
| 10 | 3 | 80 | 3000 | 300 | 1080 | 1000 | 519 | 48 |
| 10 | 4 | 100 | 9500 | 950 | 3420 | 1000 | 774 | 23 |

around the bundle to heat each exhaust line. In another embodiment, exhaust lines from multiple pumps are combined together at a manifold to form one common exhaust line. The integrated pump of the present invention can be ventilated by flowing air through and around the interior components and housing. For example, in one embodiment, air is pulled into a first end of the pump having through ventilation slots therein and the air is collected at a second end of the pump housing and vented away. Also, a small housing is formed over the exhaust connection of the pump to ventilate the connection.

Figure 7:
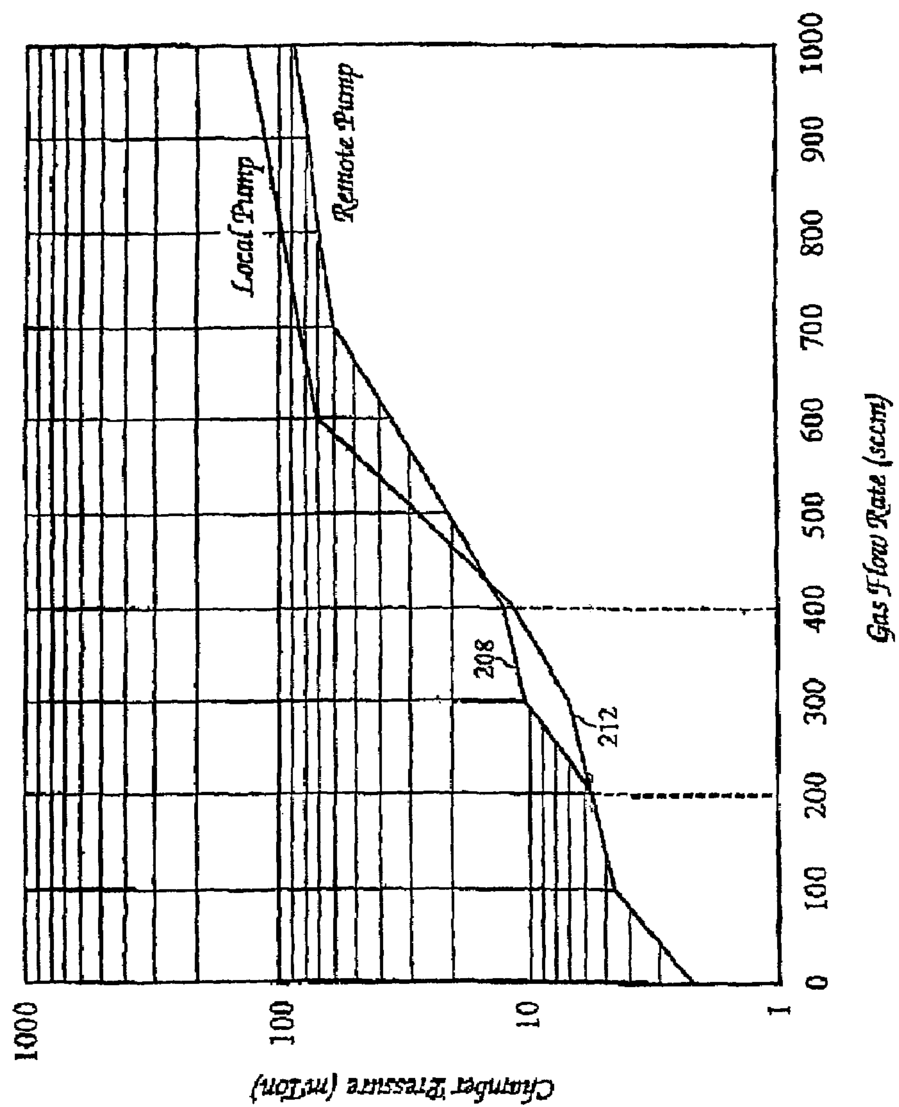
FIG. 7 is a graph of the measured pressure in a chamber for increasing gas flow rates showing the improved processing window obtained by an integrated pump versus a remote pump.

FIG. 7 is a graph showing the change in pressure in a chamber as a function of increasing gas flow showing the improved processing window obtained by the integrated pumping system 155 as compared to a remote pumping system 35. Line 208 is the pressure versus gas flow curve for a remote set of pumps comprising a 80 $m^3$/hr pre-vacuum pump and a 500 $m^3$/hr low vacuum pump. Line 212 is the curve for an integrated pumping system 155 comprising a single 100 $m^3$/hr pre-vacuum pump. Both pumping systems 35, 155 used a 2000 1/s turbo molecular high vacuum pump 160. The integrated pumping system 155 had two advantages over the remote pumping system 35. First, the dual pumps having capacities of 80/500 were replaced by a single pump having a capacity of 100 $m^3$/hr. In addition, the pump with the large capacity of 500 $m^3$/hr, which used a lot of energy, was expensive and had a large footprint, was eliminated by the much smaller capacity pump of 100 $m^3$/hr. Also, the integrated pumping system 155 obtained wider process window in the flow range of 200 to 400 sccm, which is a commonly used flow range for many processes with lower pressures of 6 to 10 m Torr.

In a preferred embodiment, an integrated pump 165*c* is connected directly to a chamber 110 without any length of foreline at all. Eliminating the foreline increases pump capacity and reduces contamination from the forelines and valves. This embodiment is especially useful for load-lock chambers 110 that often require rapid cycling between atmospheric pressure and low vacuum pressures of 100 to 300 mTorr. For connection of inlet 170*c* of the pump 165*c* to chamber 110, the pump 165*c* must have an especially low-level of vibration during operation, a relatively small size, and not be excessively noisy. By low level of vibration it is meant a vibrational level of less than about 2.5 $m/s^2$, and more preferably less than about 1.5 $m/s^2$. This is achieved by a low vibration pump design including a smaller diameter shaft and rotational speeds of less than 10,000 rpm, and more preferably less than 7,000 rpm. The small size of the pump 165*c* is typically less than about 65 liters, and more preferably less than about 40 liters. These small pump sizes are achieved by higher rotational speed, optimal pumping stages, and motor design. Additionally, to further isolate residual floor vibration in the clean room, the integrated pump can be mounted directly to a vibration isolating mat. In one embodiment, a metal plate approximately the size of the pump is fixed to the clean room floor. The surface of the plate is covered with vibration absorbing material as well as dampeners at each corner of the plate to facilitate connection of the plate to the floor. The absorbing material is formed with channels allowing the wheels of the integrated pump to move across the surface of the mat and self locate the pump in the center therefor. The mat will further isolate residual pump vibration from the raised, clean room floor tile.

Figure 8:
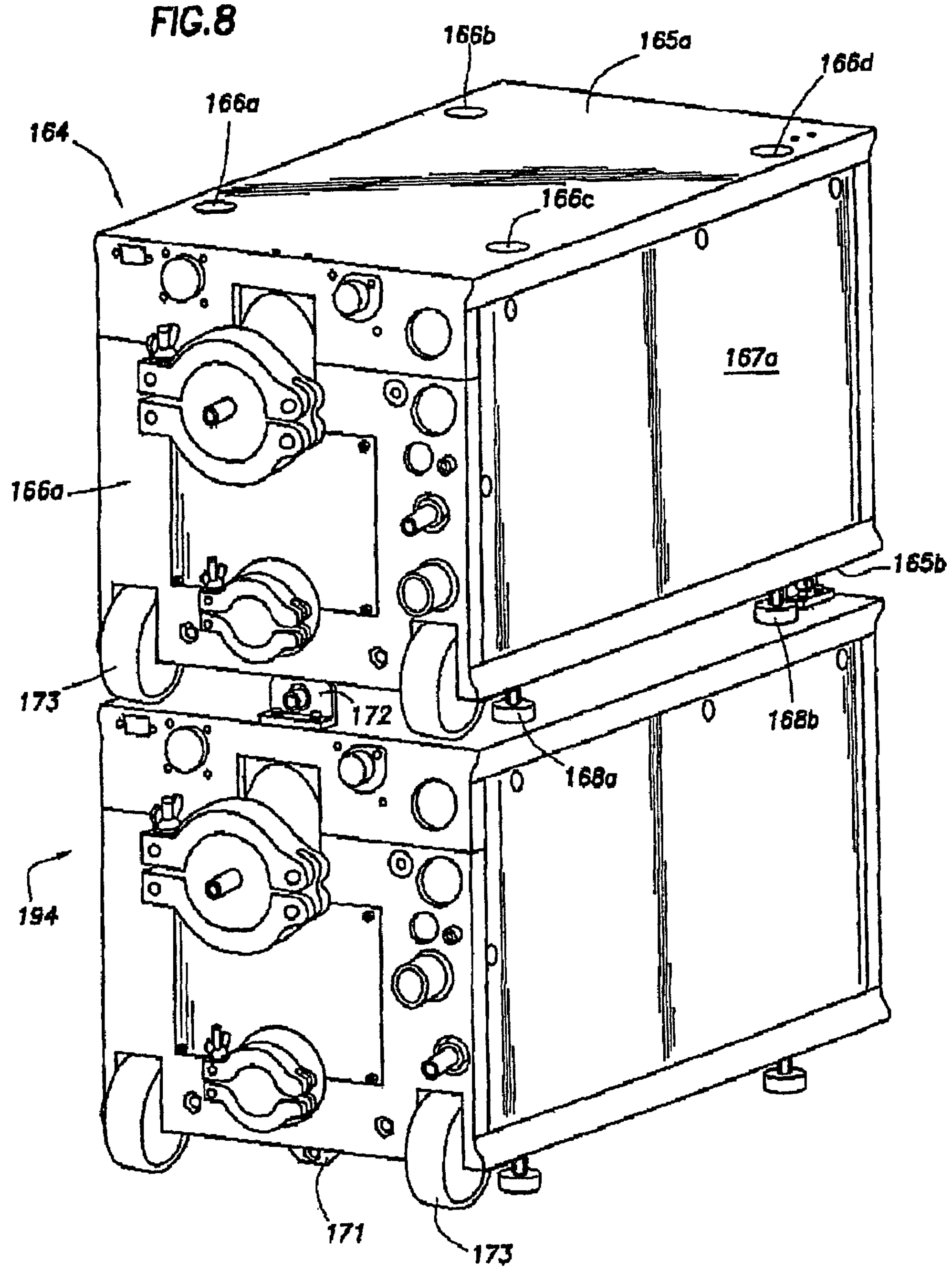
FIG. 8 is a perspective view of two integrated pumps, vertically stacked and each enclosed in a noise and vibration reducing enclosure.

In addition, the pump 165*c* should not be excessively noisy to allow operation within the clean or semi clean room. A sufficiently low noise level is below 58 dB. In the integrated pump of the present invention, this is achieved by reducing and isolating mechanical vibrations and gas compression noises. For example, the noise of the pumps is reduced by building an enclosure around the pump mechanism and utilizing sound insulating and dampening material within the enclosure. FIG. 8 depicts one such enclosure design. As can be appreciated from FIG. 8 (showing two pumps stacked together vertically), the pump is housed in an enclosure consisting of a top surface 165*a*, a bottom surface 165*b*, two end surfaces 1 66*a,b* and two side surfaces 167*a,b*. At least four rubber dampeners (not shown) are used between the moving or vibrating parts of the pump and sound absorption material is attached to the inside walls of the pump enclosure. Sound tests have demonstrated that the integrated pump are substantially quieter than the prior art, remote pumps. For example, an Applied Materials Model IPUP (Integrated Point-of-Use Pump) 100 pump, having a capacity of 100 $m^3$/hr, run at a base pressure and measured from a distance of 1 meter produced a noise level measured at under 58 dB, a significant reduction over the prior art pumps that produce noise of 65 dB when measured under similar test conditions. It is important to note that a 3 dB noise reduction is defined as cutting the noise energy in half and a 6 dB reduction means reducing the noise energy by a factor of 4. In an additional embodiment, noise is further reduced by wrapping sound insulating material around the pump motor and gear box.

The enclosure shown in FIG. 8 also facilitates simple and economical ventilation of the integrated pump. In one embodiment, air is drawn in one end of the pump enclosure, circulated through the interior of the enclosure and then exhausted from a second end of the pump through a ventilation exhaust line. In order to capture any gas leaks at the exhaust connection of the pump, a shroud can be mounted over the exhaust connection and the ventilation exhaust line can be connected thereto. In this manner, the air around the exhaust connection of the pump is removed with the ventilation air. If desired, a gas leak detector may be placed at any location in or near the ventilation exhaust line.

As shown in FIG. 8, connection points for machine interfaces like gas, liquid, and power are conveniently located on one end surface 166*a* of the integrated pump. Machine interfaces typically include connection points for power, display cable, gas inlet, exhaust, nitrogen, as well as water inlet and return and a nitrogen regulator. The location of the forgoing on a single, end surface of the pump facilitates locating the pump in a space-saving manner and also allows the pumps to be stacked without obstructing access to any interface. To facilitate easy movement within the apparatus footprint, the integrated pump is provided, in one embodiment, with means for moving the pump along a surface. Visible in FIG. 8 are rollers 173 mounted at one end of the pump 164 and partially housed therein. At an opposite end of the pump (not visible) is a pivoting roller and a connection point for a removable handle to allow personnel to easily and quickly roll the pump from one location to another without the need for lifting the pump off of the clean room floor.

Because of its small size and the arrangement of all machine interfaces on a single surface, the integrated pump of the present invention can not only be placed adjacent the chambers but any number of different arrangements of pumps are possible within the footprint, or even the same envelope as the apparatus. Additionally, because of their proximate location to the chambers and efficient operation, the integrated pumps can operate one or more chambers, thereby eliminating the need to have one pump for each chamber in some circumstances.

Figure 9A:
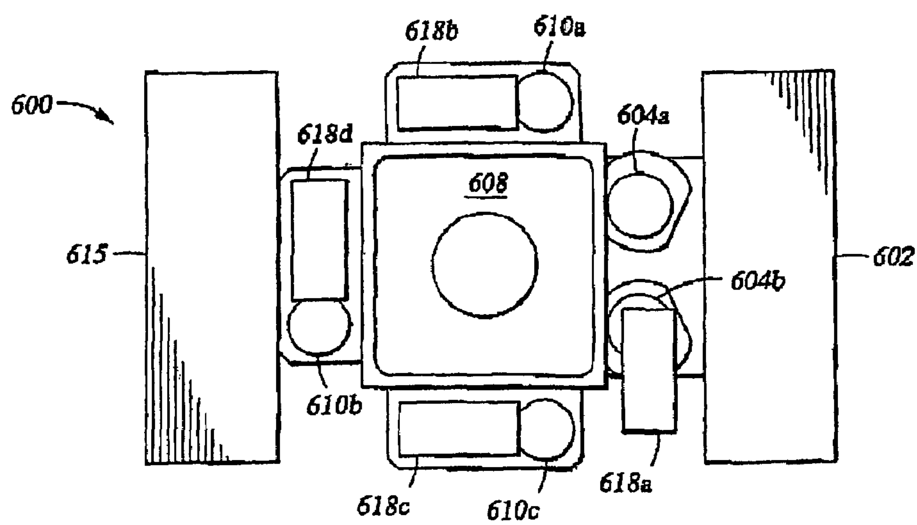
FIG. 9*a* is a schematic bottom view of an apparatus showing one arrangement scheme of a number of integrated pumps within the apparatus envelope.

FIGS. 9*a–d* depict some different substrate processing apparatus and the layout of components associated with each. To clearly demonstrate the location of the integrated pumps in relation to the other components, bottom views are depicted of each substrate processing apparatus. Apparatus 600 shown in FIG. 9*a* is similar to an apparatus made and sold by Applied Materials, Inc. of Santa Clara, Calif. under the trademark PRODUCER®. The apparatus is used primarily to process substrates using a CVI) process. Substrates enter the apparatus through an interface 602 where they are received into one of two load-lock chambers 604*a,b*. The substrates are then retrieved from the load-lock chambers by a robot located in a transfer chamber 608. The substrates are then deposited or retrieved from any of three double process chambers 610*a–c*. Gas for the various processes is supplied from gas panel 615. The apparatus 600 of FIG. 9*a* utilizes four integrated pumps 618*a–d*. Integrated pump 618*a* operates load-lock chambers 604*a,b* as well as transfer chamber 608. Pumps 618*b–d* each operate one of the double process chambers 610*a–c*.

In the preferred embodiment, pumps 618*b–d* are installed underneath the process chambers 610*a–c* which are raised some distance above the clean room floor. Additionally, pump 618*a* is located partially beneath load-lock chamber 604*b* which is also raised above the clean room floor in the preferred embodiment. Those skilled in the art will appreciate that the pumps could be arranged in different ways and still be within the envelope of the apparatus 600. For example, the pumps could be positioned at a 45° angle at each corner of transfer chamber 608.

Figure 9B:
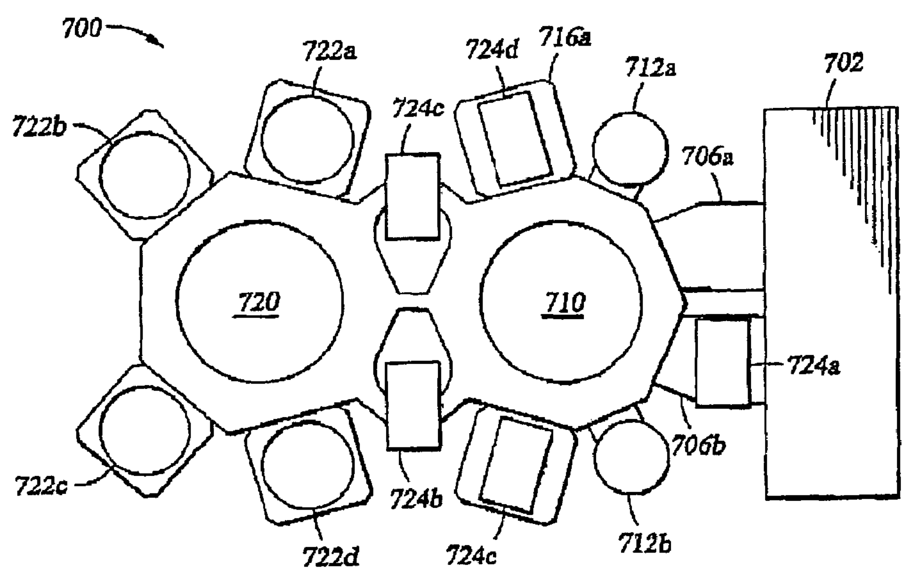
FIG. 9*b* is a schematic bottom view of an apparatus showing another arrangement scheme of a number of integrated pumps within the apparatus envelope.

Apparatus 700 is similar to an apparatus made and sold by Applied Materials under the ENDURA® trademark. The apparatus includes interface 702 where substrates are placed by personnel and subsequently moved to one of two load-lock chambers 706*a, b*. The substrates are then retrieved from the load-lock chambers by a robot located in a buffer chamber 710 and then deposited in one of two degas/orienting chambers 712*a, b* and then one of two CVD chambers 716*a, b*. Apparatus 700 also includes transfer chamber 720 which services four physical vapor deposition chambers 722*a–d*. In the embodiment shown in FIG. 9*b*, apparatus 700 includes five integrated pumps 724*a–e*. Pump 724*a* operates both load-lock chambers 706*a, b*. Pump 724*b* operates the preclean chamber 716*c*. Pump 724*c* operates physical vapor deposition chambers 722*a–d* as well as buffer chamber 710 and transfer chamber 720. Because they are PVD and high vacuum chambers, chambers 722*a–d*, 710 and 720 each rely upon a high vacuum pump (not shown) in addition to an integrated pump 724*c* to achieve and maintain an adequate vacuum. Pumps 724*d,e* each operate one of the CYD chambers 716*a,b*. In the arrangement of apparatus 700, pump 724 is partially housed under load-lock chamber 706*b* while the other two pumps 724*b,c* are partially disposed under the apparatus and partially disposed between adjacent process chambers 716*a* and 722*a* and 716*b*, and 722*d*. Other arrangements of the pumps are possible and the arrangement depicted in FIG. 9*b* is by no means limiting.

Figure 9C:
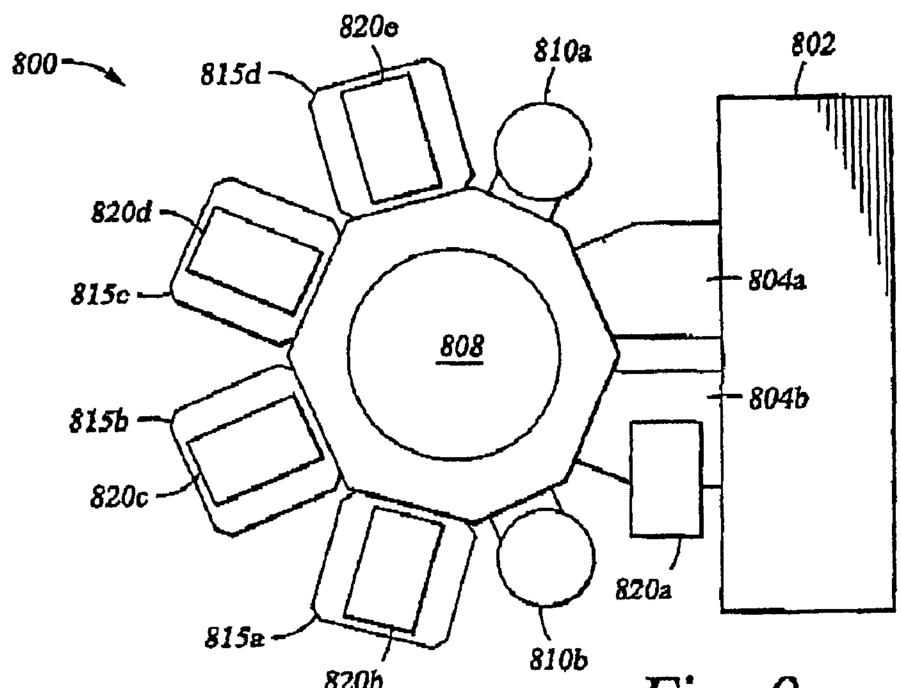
FIG. 9*c* is a schematic bottom view of an apparatus showing another arrangement scheme of a number of integrated pumps within the apparatus envelope.

An alternative architectural arrangement using the integrated pumps of the present invention is shown in FIG. 9*c*. An apparatus similar to apparatus 800 is made and sold by Applied Materials under the CENTURA® trademark. In this embodiment, substrates are loaded in clean room interface 802 and subsequently moved to load-lock chambers 804*a, b*. Substrates are then retrieved from the load-lock chambers by a robot located in transfer chamber 808 where they are subsequently placed into and retrieved from one of two orienting chambers 810*a, b* and four process chambers 815*a–d*. Because the process chambers may involve etch processes, each chamber may also be also serviced by a high vacuum pump (not shown) in addition to an integrated pump.

In the preferred embodiment of apparatus 800, four integrated pumps 820*b–e* are placed directly under the process chambers 815*a–d*, which are raised off of the clean room floor. The integrated pump 820*a* operating the load-lock chambers 804*a,b* is partially located under load-lock chamber 804*b*. Optionally, to have an independent pump for transfer chamber 808, a sixth pump can be stacked under pump 820*a* similar to the dual stacking arrangement shown in FIG. 8. Those skilled in the art will appreciate that the pumps need not be placed directly underneath the chambers to be utilized in a space effective manner and remain in the envelope of the apparatus 800. For example, pumps 820*b–e* could be placed between the chambers in an alternating, radial manner and remain within the envelope of the apparatus and within the scope of the invention.

Figure 9D:
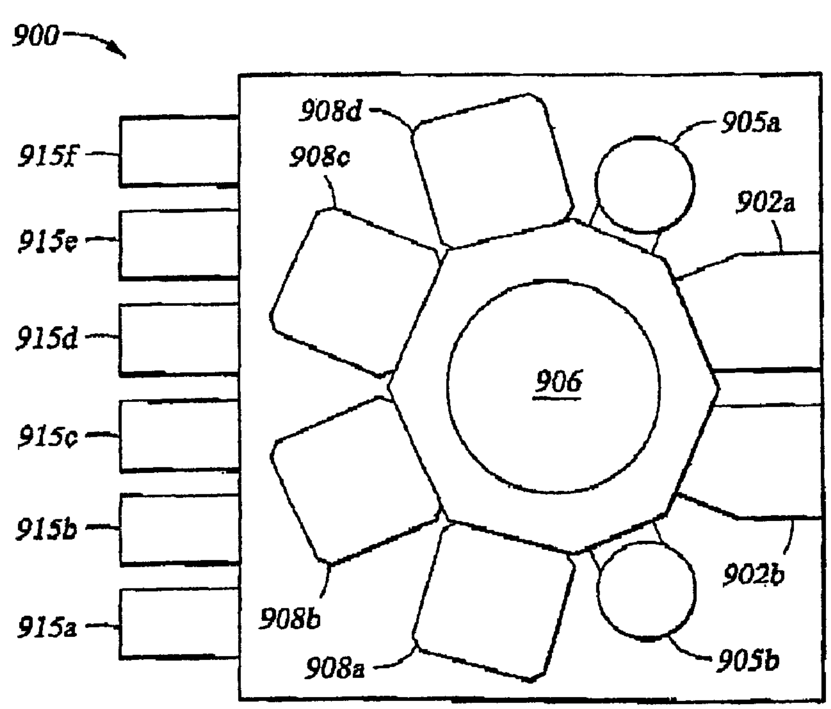
FIG. 9*d* is another schematic bottom view of an apparatus showing yet another arrangement scheme of a number of integrated pumps within the apparatus envelope.

Another possible layout of integrated pumps within an apparatus envelope is shown in FIG. 9*d*. In this apparatus 900, two load-lock chambers 902*a,b* supply transfer chamber 906 with substrates which are then transferred to one of two orienting chambers 905*a,b*, and then to one of four process chambers 908*a–d*. The apparatus 900 utilizes six integrated pumps 915*a–f* which, in the embodiment shown, are arranged at one end of apparatus 900. A first pump 915*a* operates load-lock chambers 902*a,b*. A second pump 915*b* operates transfer chamber 906. The other pumps 915*c–f* each operate one of the four chemical vapor deposition vacuum chambers 908*a–d*.

In FIGS. 9*a–d*, the arrangement of the pumps with respect to apparatus 900 are shown for illustrative purposes and the actual arrangement of pumps in a similar apparatus could take on any number of different configurations, limited only by the physical dimensions of the integrated pump. In one embodiment for instance, the pump enclosure measures only about 0.3 m in width, 0.6 m in length and about 0.3 m in height. In another embodiment, the pump has a vertical orientation with a height, length and width ratio of about 2:1:1.

In addition to positioning individual pumps within an envelope of an apparatus, the integrated pump can be stacked vertically so that two pumps require no more clean room surface than a single pump. For example, in FIG. 9*c* the pump 820*a* operating the two load-lock chambers 804*a,b* could be replaced with two pumps stacked vertically, wherein one pump operates both load-lock chambers 804*a,b* and the other pump operates transfer chamber 808.

FIG. 8 is a perspective view illustrating the stackable feature of the integrated pump. Each pump 164, 194 includes four recessed landing indentations 166*a–d* on its top surface. Landing indentations are arranged to receive similarly spaced, adjustable landing feet 168*a–d* (only two shown) located at the bottom surface of each pump 164, 194. The enclosure of the pumps is also designed to withstand the weight of another pump and even the weight of clean room personnel who might use the pump as a step. After the pumps are stacked, a tab 171 extending downward from the front edge of the bottom surface of the pump enclosure aligns with a mating, upwardly extending tab 172 installable on the front and rear of the top surface of the pump. Each tab 171, 172 includes an aperture there through allowing the pumps to be bolted together and secured in the stacked orientation. Tab 171 can also be utilized to fix the pump to the clean room floor to prevent movement during operation.

Figure 10A:
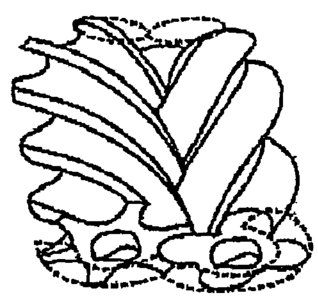
FIG. 10*a* is a side view of a pre-vacuum pump having an auger screw on a shaft.
Figure 10B:
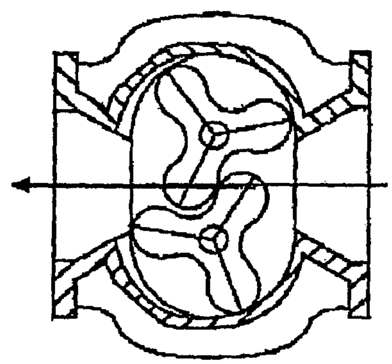
FIG. 10*b* is a schematic side view of a pre vacuum pump having a roots-type mechanism.
Figure 10C:
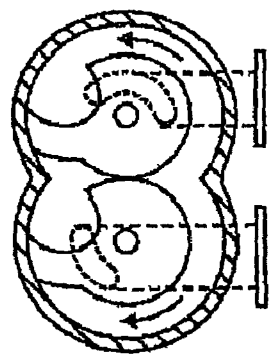
FIG. 10*c* is a schematic side view of a pre-vacuum pump having a rotor with an interdigited hook and claw assembly.
Figure 10D:
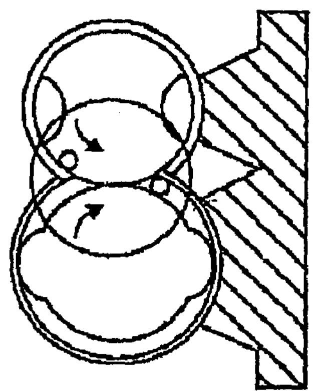
FIG. 10*d* is a schematic side view of a pre-vacuum pump having an interdigited tongue and groove assembly.

The integrated, pre-vacuum pumps 165*a*–*c* of the present invention can be a roots, screw, hook and claw, tongue and groove, or similar type pump. Preferably, the pre-vacuum pump 165*a* is a screw, roots, hook and claw, or tongue and groove pump that comprises one or more evacuating members that rotate to evacuate gas from a chamber. For example, FIG. 10*a* shows a schematic of a screw pump having a plurality of screw augers that have interlacing blades. The size of the screw augers and the speed of the shaft controls the pump capacity or speed which is a rate at which the pump evacuates gas from a chamber. FIG. 10*b* shows a schematic of a roots-type pump which has two or more rotors also with interdigited blades. In another embodiment, as shown in FIG. 10*c*, the pump comprises a plurality of parallel shafts, each having a hook and claw mechanism that interact with one another to evacuate gas from the chamber. In yet another embodiment, shown in FIG. 10*d*, the pump comprises a rotating member comprising a tongue and groove mechanism on a plurality of shafts. Combinations of these pump mechanisms are also possible.

In the preferred embodiment, the integrated pump is a "dry" pump that does not use lubricant in the vacuum producing parts of the pump. However, those skilled in the art will appreciate that the pump could be constructed to utilize lubrication in the vacuum producing parts and this variation is fully within the scope of the invention.

In order to avoid the use of the slow and unresponsive valves of conventional apparatus, the pressure of the gas in one or all of the chambers is preferably controlled by an open or a closed loop pressure controller 220 that adjusts the speed of the pump, rather than the condition of a valve, to change the pressure of gas in a chamber. For example, FIG. 2 shows a pressure controller 220 comprising at least one pressure gauge 225 connected to the chamber 120 for providing a pressure signal $P_S$ in relation to the pressure of the gas in the chamber 120. For simplification, the controller is shown in operation with only the process chamber. However, it will be understood by those skilled in the art that a controller could be used to adjust the speed of any of the integrated pumps and thus control the pressure of any of the chambers. Additionally, a signal could be provided to the pressure controller from a timer or timer signal from a computer controller. The analog or digital pressure signal $P_S$ is transmitted to a pump controller 230, such as a P, PI, or PID or similar controller and/or a computer system 235, that compares the signal $P_S$ to a target pressure $P_T$, and changes the speed of a motor 240 of the pump 165*a* in relation to the difference P between the measured and target pressures. A set of rules, such as proportional-integral-derivative rules, are used to adjust the speed of the pump 165*a* in a functional relation to $\Delta P$. As $\Delta P$ becomes larger, the increase in pump speed is set to be correspondingly higher, as $\Delta P$ is reduced, the pump speed is set to be correspondingly lowered. In addition, the internal and exhaust pressures of the pump 165*a* can also be measured using additional gauges and sensors (not shown). The pump controller 230 can be a single controller or a set of controllers that cooperate to perform the pressure measurement, comparison of measured and set-point pressures, and adjustment of the pump speed. Alternatively, the temperature of a chamber could be measured and the speed of the pumps adjusted so as to avoid a chamber temperature reduction that could lead to the formation of condensation within the chamber.

Preferably, the pump controller 230 changes a rotational speed of the pump 165*a*. The rotational speed of the pump controls the pump capacity which is the rate of which the pump evacuates a volume of gas from the chamber. Preferably, the pre-vacuum pump 165*a* has a low rotational speed that is less than about 10,000 rpm, and more preferably less than about 7,000 rpm. The low rpm is advantageous because it reduces the vibration of the pump during use and reduces power consumption and response time during speeding up and down for pressure control.

In another aspect of the present invention, a variable speed pump is operated by a programmable speed controller (not shown) to closely match an optimal complex-shaped curve of pressure reduction versus time in a chamber. The modeled pressure reduction versus time curve for a chamber is used to rapidly reduce the pressure of gas in the chamber and avoid condensation. The complex-shaped smooth curve cannot be closely matched by the step changes in opening size of a two-stage or conventional soft-start valves, like those used with the load-lock chamber in FIG. 1. In contrast, by adjusting the rotational speed of the pump through a predetermined range of speeds that can be continuously varied through an entire range of rpm, it is possible to closely trace and match the optimal pressure/time curve.

Figure 11A:
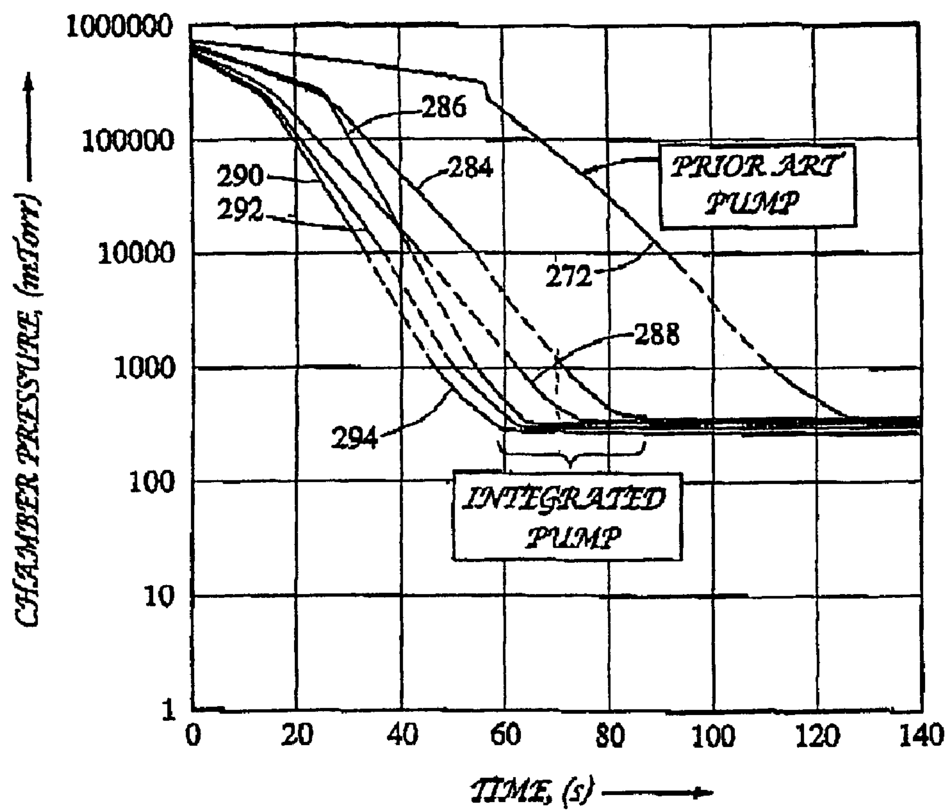
FIG. 11*a* is a graph of chamber pressure versus pumping time for different pump down cycles comparing integrated and remote pumping systems for a given chamber size.

FIG. 11 a shows the pressure reduction curves obtained for different configurations of remote and the integrated pumping systems 35, 155 To compare the reduction in pumpdown time achieved by the integrated pumps with remotely located conventional pumps, both sets of pumps were operated to evacuate a load-lock chamber. The pumps had different pumping capacities and were operated at different rotational speeds to optimize their pumpdown process cycle. Referring to FIG. 11*a*, line 272, shows pump-down pressure/time cycles for a remote pump, which has a pump-down time of about 135 seconds. In contrast, lines 284 to 294 are pump-down pressure/time cycles of integrated pumps that were positioned abutting the platform and chambers and with a short foreline having a length of 2 m and a diameter of 50 mm. The integrated pumps had an average pump-down speed of about 65 seconds, which is twice as fast as the remotely located, conventional pumps.

In these examples, a soft-start valve was used with the remote, conventional pumps and a two-step speed adjustment was used with the integrated pumps to control the rate of pressure reduction in the chamber. Some of the pumps used soft-start valves having two opening sizes comprising a small opening size that was initially opened to bring the chamber down from atmospheric pressure to a pressure of 200–300 Torr, and a large opening used to reduce the chamber pressure down to about 0.1 Torr. The change in slopes of the pump down cycles was obtained by either changing from the small to the large valve in the case of the remote pumps, or from one rotational speed to another in the case of the variable speed integrated pumps. For example, the rotational speeds of the pumps were set at one or more of 20, 30, 40, 45, 60, 80, and 100 Hz. Pairs of rotational speeds were used for each integrated pump, including a lower speed and a higher speed, to achieve optimal fast and soft pump down. It is seen that an optimal pump-down cycle was obtained for an integrated pump having a capacity of 100 $m^3$/hr operated at rotational speeds of 40/100 Hz, 290, 294.

Figure 11B:
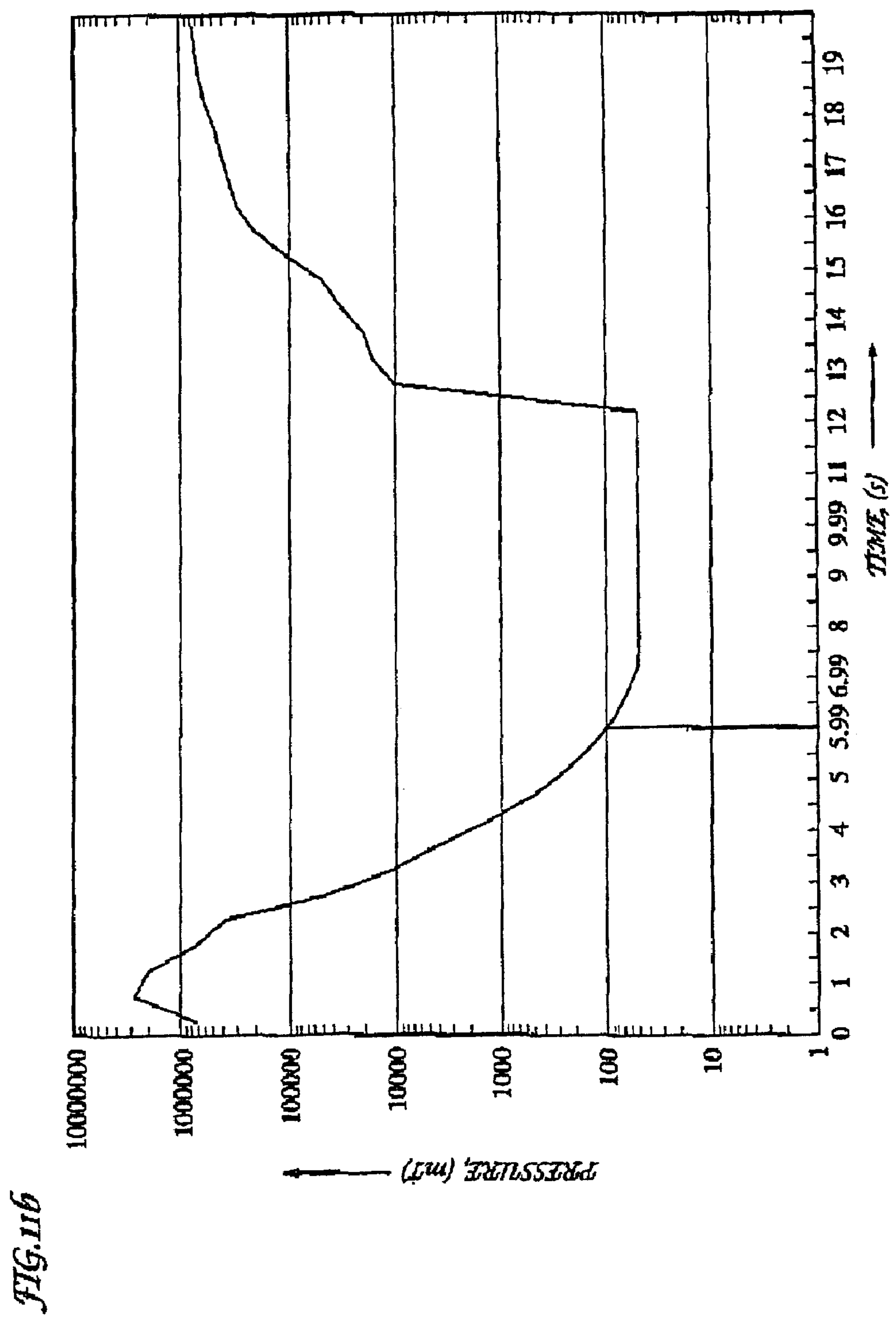
FIG. 11*b* is a graph of chamber pressure versus pumping time for a load-lock chamber using an integrated pump and only an isolation valve.
Figure 11C:
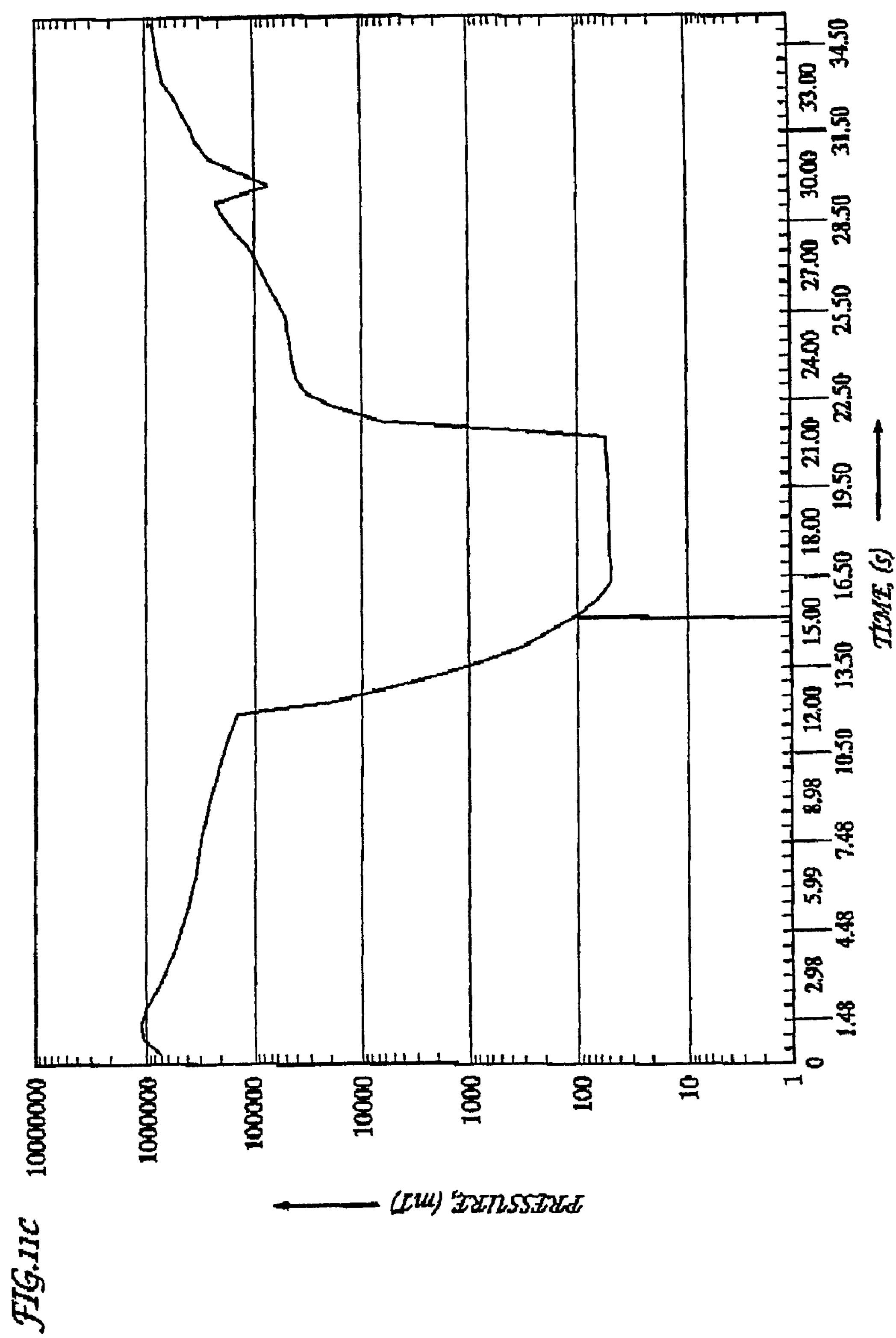
FIG. 11*c* is a graph of chamber pressure versus pumping time for a load-lock chamber using an integrated pump and a soft start valve.

FIG. 11*b,c* also show pressure reduction curves. Theses curves were obtained for a single wafer, smaller volume load-lock chamber used with an integrated pump. In the curve of FIG. 11*b*, an integrated pump was used with only an isolation valve to pump down a load-lock chamber in 5.9 seconds. In FIG. 11*c*, a two stage valve of the prior art apparatus was used with the integrated pump to reduce the load-lock chamber to a desired pressure in 15 seconds. The curves of FIGS. 11*b,c* demonstrate improved performance of the integrated pump over the prior art pumps, even when used with a soft-valve to evacuate a vacuum chamber.

Figure 12:
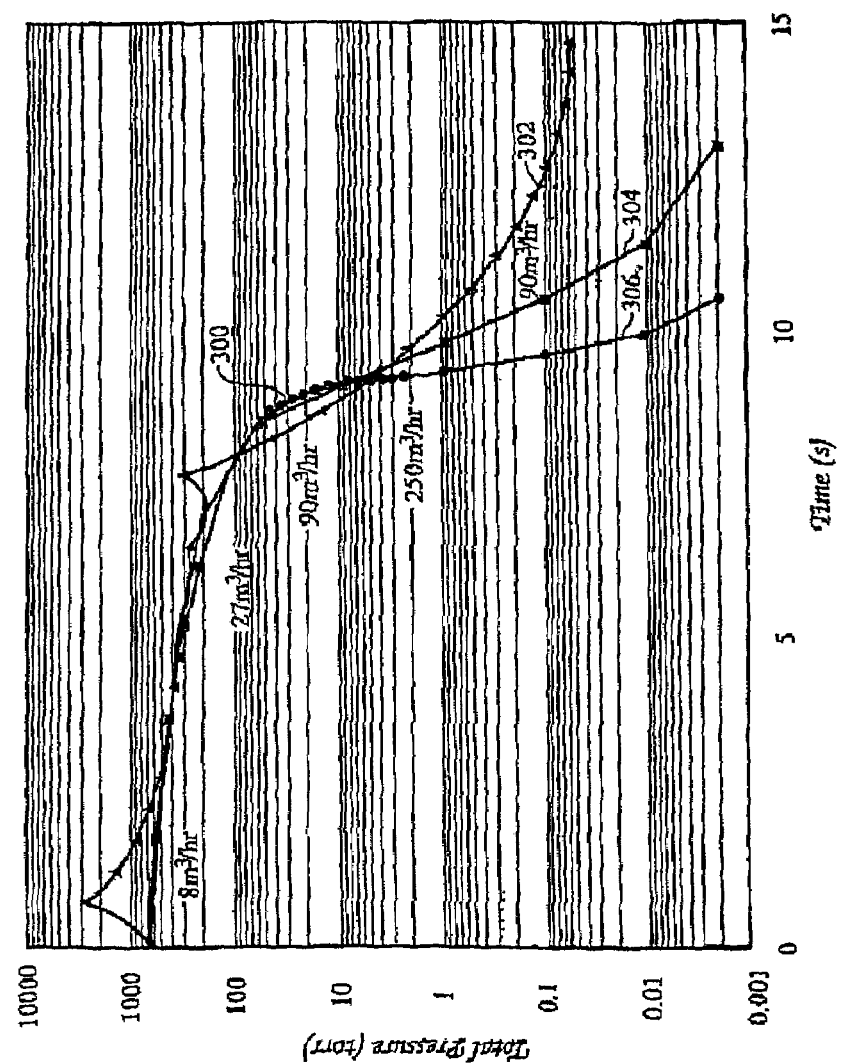
FIG. 12 is a graph showing a computer-generated model of an optimal pressure reduction curve to avoid condensation in a chamber, and various chamber pressure reduction curves obtained for different sets of selected pump speeds.

FIG. 12 shows a computer-generated model of a pressure reduction curve for a process chamber that can be used to rapidly reduce the pressure of gas in the chamber without condensation. The computer simulation model was generated for a chamber having a volume of about 6 liters. The rotational speed of an integrated pump mounted on a process chamber was varied through a selected set of increasing speeds to closely match the pressure reduction curve. The set of pump speeds were selected to closely trace the pump capacity or speed to the maximum allowable capacity denoted by the modeled pressure reduction curve, as shown by line 300. In FIG. 12, line 302 shows the measured pressure reduction curve obtained in the chamber, when the pump was run at 30 $m^3$/hr during the initial pressure reduction from atmospheric pressure to 200 Torr, and thereafter, run at 90 $m^3$/hr for pressure reduction down to 0.1 Torr. Line 302 took the longest time of about 13 seconds to reach 0.1 Torr without condensation in the chamber and did not closely match the pressure reduction curve. Line 304 shows the reduction in pressure obtained in the chamber, when the pump was first run at 27 $m^3$/hr during the initial pressure reduction from atmospheric pressure to 200 Torr, and thereafter, run at 90 $m^3$/hr for pressure reduction down to 0.1 Torr. This followed more closely the modeled condensation curve and took a shorter time of 11 seconds to reach 0.1 Torr without condensation providing an improvement in pump down time of about 2 seconds. Line 306 shows optimal results in which the pump was operated through a set of speeds of 8, 27, 90, and 250 $m^3$/hr, which more closely followed the modeled pressure reduction curve and reduced pump down time from atmospheric pressure to 0.1 Torr in less than about 9 seconds without condensation. Thus, a series of continuous or step changes in the effective or rotational speed of the pump provides an optimal pump down cycle that avoids condensation in the chamber. The number of step changes depends on the shape of the modeled condensation curve, pump capacity, and the volume of the chamber.

Figure 13:
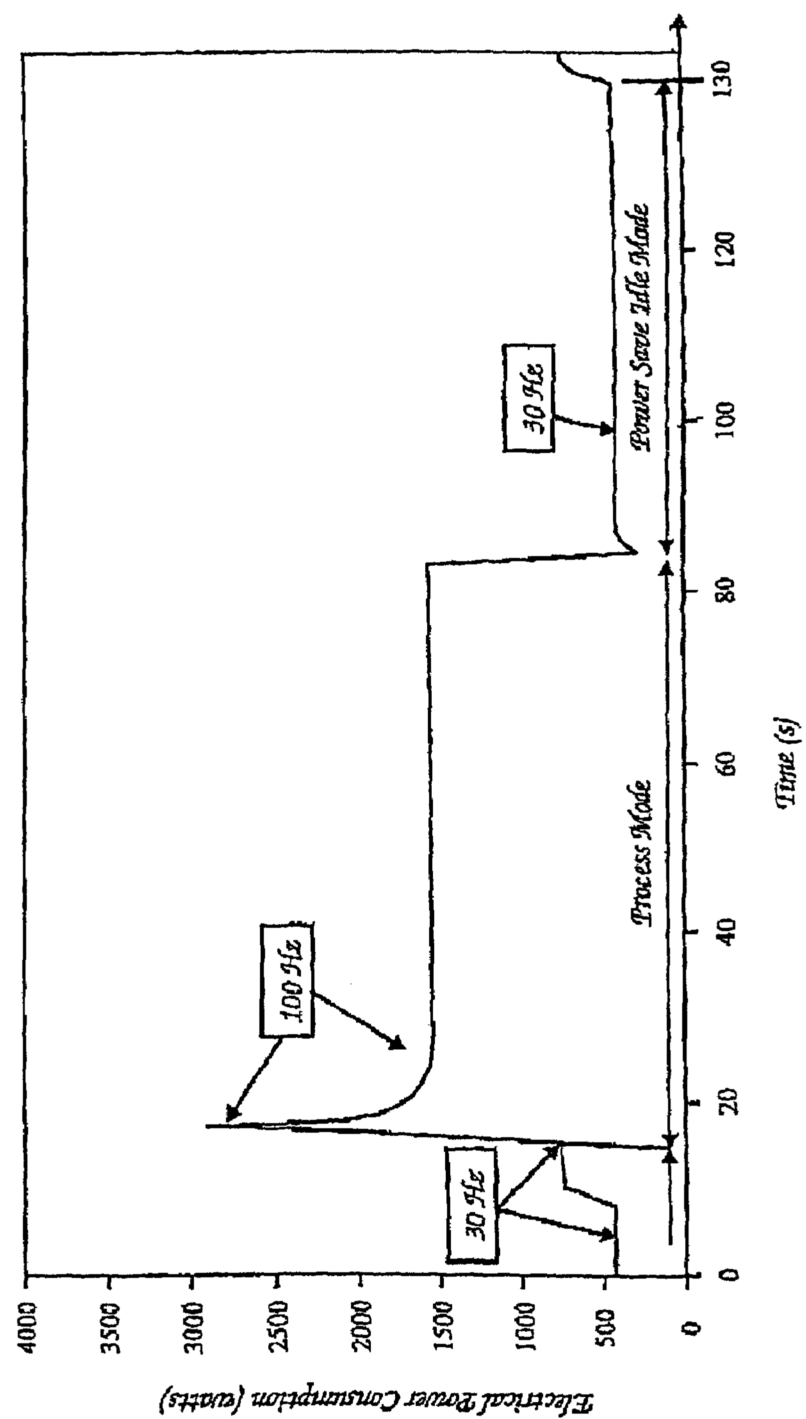
FIG. 13 is a graph of the electrical power consumption of a pumping system showing the energy savings obtained during a typical pump down operating cycle.

The reduction in pump down time is particularly important for the load-lock chamber 110 which is often pumped down from atmospheric pressure to low vacuum pressures. The load-lock chamber 110 is pumped down every time a new batch of substrates is inserted into the load-lock or a processed batch of substrates is removed from the load-lock chamber. Thus, the load-lock chamber 110 is often cycled between atmospheric pressure (during loading and unloading of substrates) and low pressures during processing or transferring of the substrates 20 from the load-lock chamber 110 to a process chamber 120. The large number of pump-down cycles, relative to the process chamber 120 which remains at low pressures throughout processing, require fast pump down cycles from atmospheric to low pressure levels of less than about 0.1 Torr. The pumping system 155 of the present invention also provides considerable energy conservation over conventional pumping systems 35. The variable speed, integrated, pre-vacuum pump 165*a–c* can also be operated more efficiently by reducing the high speed maintained during the operational mode to a low speed or power saving idle mode. FIG. 13 is a graph of the electrical power used by the pumping system 155 versus time showing the energy savings obtained during pump-down of a load-lock chamber 110. Initially, from 0 to about 18 seconds, the pre-vacuum pump is operated at a relatively low speed of about 30 Hz from atmospheric pressure down to about 200 Torr—during which time the pump uses a relatively small amount of energy of 500 to 750 watts. Thereafter, the pump speed is accelerated from 30 to 100 Hz over a period of 1 to 2 seconds to achieve a vacuum of about 0.1 Torr in the chamber—the peak energy used during this time is about 3000 watts. Once a low pressure equilibrium state of vacuum is obtained in the chamber, even though the pump continues to operate at 100 Hz, a much smaller amount of energy of about 1500 watts can be used to maintain the load-lock chamber at a low pressure. When the load-lock chamber does not contain substrates, the pump is operated in a power saving idle mode at about 30 Hz to use a very small amount of energy of about 500 watts. Conventional pumps operate at a continuous maximum speed of 50 Hz and 60 Hz, depending on the country network frequency, and use from 3,000 to 8,000 watts. In contrast, the variable speed pump operates at a much lower average energy level of about 500 to 1500 watts, thereby consuming about 6 times less energy than conventional pumps.

Because of its relatively small size and lower power requirements, the integrated pump of the present invention releases much less energy in the form of heat during its operation than the larger, prior art, remotely located pumps. For example, an integrated pump using 2.1 kW of energy will release about 0.18 kW of heat to air, 1.62 kW of heat to water and 0.3 kW of heat to exhaust.

Figure 15:
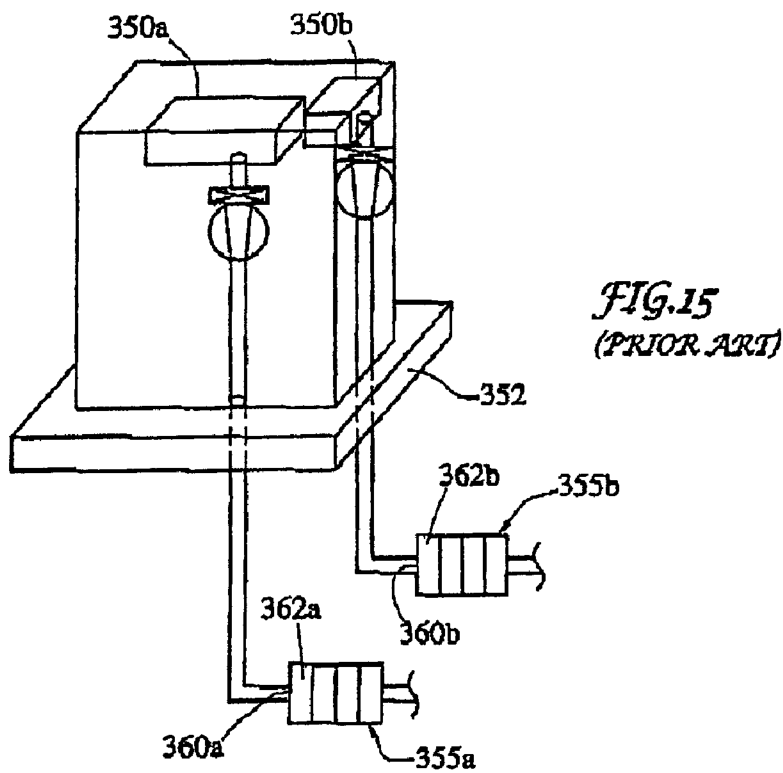
FIG. 15 (prior art) is a schematic diagram of a conventional semiconductor processing apparatus showing multiple chambers that are each evacuated by separate pumping system.
Figure 14A:
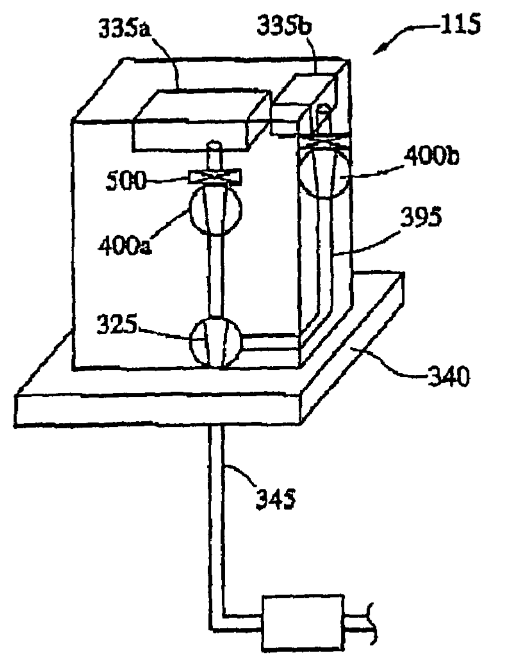
FIG. 14*a* is a schematic diagram of a semiconductor processing apparatus of the present invention showing multiple chambers connected to different stages of a single, integrated pre-vacuum pump.
Figure 14B:
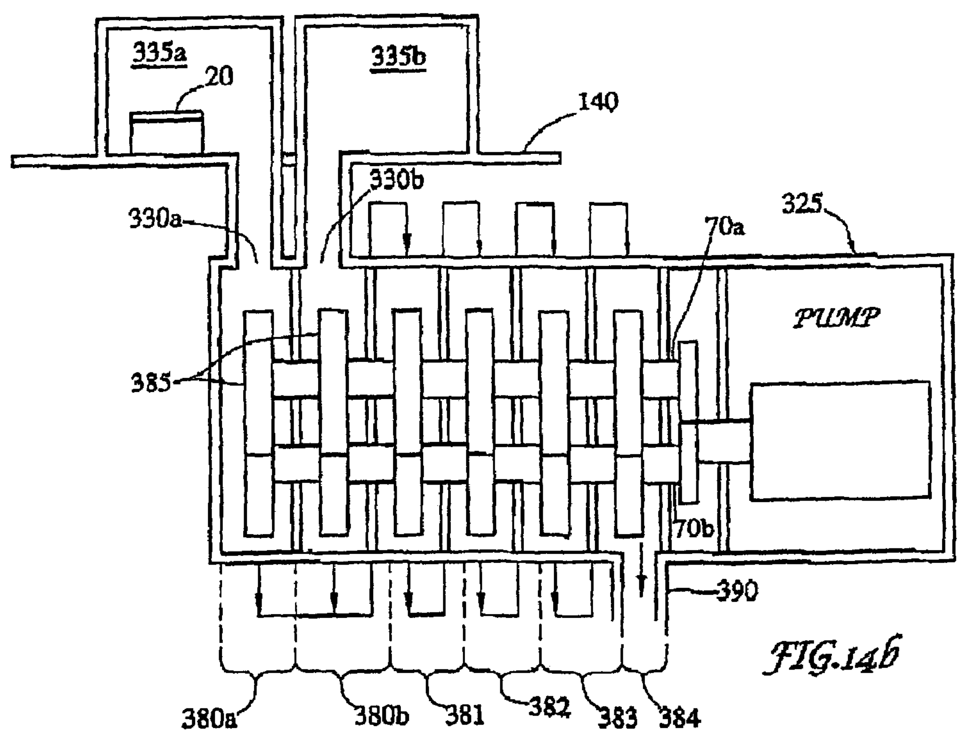
FIG. 14*b* is a sectional schematic side view of the integrated, pre-vacuum pump of FIG. 12*a* showing a plurality of inlets ports and inlet stages.

In another aspect of the present invention, as shown in FIGS. 14*a* and 14*b*, the integrated, pre-vacuum pump 325 (FIG. 14*b*) comprises a plurality of inlet ports 330*a,b*, each connected to an inlet stage 380*a,b* of the pump 325. In prior art systems, as schematically shown in FIG. 15, each pump 355*a,b* had one inlet port 360*a,b* in a single inlet stage 362*a,b*, respectively. The inlet ports 360*a,b* were each connected to a separate chamber 350*a,b* on the platform 352. The use of multiple pumps 355*a,b* for a single platform 352 resulted in higher capital outlays and increased costs of maintenance of the multiple pumping systems and pipelines, especially when the pumps 355*a,b* were located at a distant or remote location from the platform 352.

In contrast, as schematically shown in FIG. 14*b*, a multiple inlet pump 325 according to the present invention, comprises multiple inlet ports 330*a,b*, each of which are connected to a chamber 355*a,b* (or a pump) to evacuate the gas in that chamber or pump. Thus, a single pump 325 can perform the work of a multiple set of prior art pumps 355*a,b*. When the platform 340 comprises a plurality of chambers 335*a,b* mounted contiguously to one another, a single multiple inlet stage pump 325 is used to pump down one or more of the chambers 335*a,b*, and thereby increase pumping efficiency, reduce capital costs by eliminating a number of pumps, and save valuable space in the clean room.

The multiple inlet pump 325 comprises a first inlet 330*a* connected to a first chamber 335*a* or high vacuum pump (not shown) and a second inlet 330*b* connected to a second chamber 335*b* or another high vacuum pump (not shown). For example, the first inlet 330*a* can be connected to a process chamber, and the second inlet 330*b* connected to the load-lock or transfer chamber, or both the first and second inlets 330*a,b* can be connected to separate process chambers. The multiple inlet pump 325 has a vacuum capacity that is capable of evacuating the plurality of chambers from a pressure of one atmosphere down to a pressure of about 0.1 Torr.

The multiple inlet pump 325 comprises one or more rotatable shafts 70*a,b* in separate gas evacuating stages 380–384. Each stage 380–384 comprises one or more shafts 370*a,b* having a plurality of interdigited stages or lobes 385 that interlace each other to form the gas evacuating means within that stage. The low-pressure end 380*a,b* of the pump 325 comprises a plurality of inlet ports 330*a,b*, each of which are connected to a single chamber 335*a,b*, respectively. The first and second inlet ports 330*a,b* can be on a single manifold that terminates to a single inlet stage (not shown) or they can be connected to separate inlet stages 380*a,b* (as shown). Preferably, the inlet ports 330*a,b* terminate at one or more separate inlet stages 380*a,b* that are connected in a parallel arrangement, by which it is meant that the outlets of these two stages do not feed into one another, but instead are combined to feed directly to a second stage 381. Thereafter, the second stage 381 feeds to the third stage 382, the third stage 382 feeds to the fourth stage 383, and the fourth stage 383 feeds to the fifth stage 384, all in series arrangement. The fifth stage 384 comprises an exhaust outlet 390 that exhausts the evacuated gas to atmosphere. The plurality of stages 380–384 in a series arrangement serve to increase the pumping efficiency or total pressure reduction achievable by the pump. The multiple inlet pump 325 provides additional cost savings by reducing the total number of pumps, valves, and pressure control systems, that are used on a multi-chamber platform 340. In addition, the footprint of the apparatus 115 is substantially reduced by use of a single pump to perform the task of multiple pumps. Also, the pumping efficiency is increased by reducing the total length of foreline piping and other pipeline obstructions, such as valves 500, which only increase losses. As a result, a pump 325 having a relatively low capacity can be used to evacuate more than one chamber, efficiently, and with good pressure control.

While the present invention has been described in considerable detail with reference to certain preferred versions, many other versions should be apparent to those of ordinary skill in the art. For example, the pre-vacuum pump can comprise a non-rotating mechanism that operates in an equivalent manner to a rotating mechanism, and the chambers can be used to process substrates other than semiconductor wafers. Thus, the apparatus, chamber, pumping system 155, and methods according to the present invention should not be limited to the illustrative embodiments of the invention described herein. Therefore, the spirit and scope of the appended claims should not be limited to the description of the preferred versions contained herein.

We claim:

1. An apparatus for processing a substrate, comprising:

a plurality of vacuum chambers, the vacuum chambers defining a peripheral envelope of space;

a plurality of pumps, each of the pumps having an inlet connected to at least one of the vacuum chambers and an outlet exhausting gas to atmospheric pressure, and wherein the plurality of pumps is disposed within the envelope of space defined by the chambers and in the immediate environment of the chambers; and a system controller, for controlling gas pressure in at least one of the chambers, and the rate of evacuation of gas from the chambers;

and wherein the plurality of vacuum chambers comprises:

at least one load-lock chamber; and at least one transfer chamber, with the at least one transfer chamber having a plurality of process chambers disposed in a radial fashion there around, and with one of the pumps being disposed beneath the transfer chamber.

2. The apparatus of claim 1, wherein the system controller is programmable to control the gas pressure by changing the speed of one of the pumps in relation to a signal from a chamber pressure gauge according to a programmed set of instructions for processing the substrate.

3. The apparatus of claim 1, wherein the system controller is programmable to control the rate of evacuation of gas by changing the speed of one of the pumps in relation to a signal from a chamber pressure gauge according to a programmed set of instructions for reducing condensation of moisture in the chamber.

4. The apparatus of claim 1, wherein the system controller is programmable to control the efficiency of at least one of the pumps by changing the speed of the pump.

5. The apparatus of claim 4, wherein the system controller is programmable to control the efficiency of at least one of the pumps by changing the speed of the pump between a low speed, a high speed and an idle speed.

6. The apparatus of claim 5, wherein the low speed is about 30 Hz, the high speed is about 100 Hz and the idle speed is about 30 Hz.

7. The apparatus of claim 5, wherein the low speed requires energy of about 500 to 750 watts, the high speed requires energy of about 3000 watts and the idle speed requires energy of about 500 watts.

8. The apparatus of claim 1, wherein one pump is disposed beneath a load-lock chamber, and two pumps are disposed each beneath one of the process chambers.

9. The apparatus of claim 1, wherein each transfer chamber has at least four process chambers and two load-lock chambers disposed therearound; and wherein the plurality of pumps comprises six pumps disposed at a first end of the envelope beneath a gas supply panel, the pumps substantially within the footprint of the apparatus.

10. The apparatus of claim 1, wherein each of the pumps includes an exhaust line and wherein the exhaust lines are bundled together to form a single exhaust bundle.

11. The apparatus of claim 10, wherein the exhaust bundle is wrapped in a heater.

12. The apparatus of claim 11 wherein the heater includes a conductor carrying electrical current to heat gas within the exhaust lines.

13. The pump of claim 1, wherein the pump is surrounded by an enclosure, the enclosure having a substantially planar top surface, bottom surface, two side surfaces and two end surfaces, and constructed and arranged to reduce noise and vibration emanating from the pump and surface temperature.

14. The pump of claim 13, wherein the height, length and width ratio of the enclosure is about 1:2:1.

15. The pump of claim 13, wherein the height, length and width ratio of the enclosure is about 2:1:1.

16. The pump of claim 13, wherein the pump is mounted on a layer of vibration absorbing material, and a plate is located between and affixed to the bottom surface of the pump enclosure and a clean room floor.

17. The pump of claim 13, wherein the pump enclosure includes a ventilation system capable of drawing air through the enclosure from a first end of the enclosure to a second end of the enclosure where the air is exhausted to a ventilation exhaust line.

* * * * *

UNITED STATES PATENT AND TRADEMARK OFFICE

CERTIFICATE OF CORRECTION

PATENT NO. : 7,051,759 B2

APPLICATION NO. : 10/945727

DATED : May 30, 2006

INVENTOR(S) : Peter Reimer, Pedram Sabouri, and Dennis Smith

It is certified that error appears in the above-identified patent and that said Letters Patent is hereby corrected as shown below:

On the Cover of the Patent

Item [75], Inventors: Please change “Paul Reimer” to --Peter Reimer--

In the Specification

Column 2, Lines 34-35: Change “conventional” to --conventionally--

Column 3, Line 46: Change “throughout” to --throughput--

Column 4, Line 57: Before “integrated”, change “a” to --an--

Column 6, Line 24: Change “arid” to --and--

Column 7, Line 13: Change “after-processing” to --after processing--

Column 7, Line 38: Change “$10^{-}9$” to --$10^{-9}$--

Column 7, Line 46: Change “additional” to --addition--

Column 8, Line 50: Change “$1/C/_T$” to --$1/C_T$--

Column 9, Line 25: Delete the comma after “the”

Column 10, Line 28: Change “$m^3$/fhr.” to --$m^3$/hr.--

Column 10, Line 30: Change “that” to --than--

Column 12, Line 9: Change “1 66a,b” to --166a,b--

Column 13, Line 9: Change “CVI)” to --CVD--

UNITED STATES PATENT AND TRADEMARK OFFICE

CERTIFICATE OF CORRECTION

PATENT NO. : 7,051,759 B2

APPLICATION NO. : 10/945727

DATED : May 30, 2006

INVENTOR(S) : Peter Reimer, Pedram Sabouri and Dennis Smith

It is certified that error appears in the above-identified patent and that said Letters Patent is hereby corrected as shown below:

Column 13, Line 51: Change “CYD” to --CVD--

Column 16, Line 24: Insert a period after “155”

Signed and Sealed this

Fourteenth Day of November, 2006

JON W. DUDAS

*Director of the United States Patent and Trademark Office*